(12) United States Patent
Matsuyama et al.

(10) Patent No.: US 8,588,952 B2
(45) Date of Patent: Nov. 19, 2013

(54) SUBSTRATE PROCESSING SYSTEM, SUBSTRATE PROCESSING METHOD AND STORAGE MEDIUM

(75) Inventors: Kenichirou Matsuyama, Koshi (JP); Takeshi Matsumoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 292 days.

(21) Appl. No.: 13/008,196

(22) Filed: Jan. 18, 2011

(65) Prior Publication Data

US 2011/0208344 A1 Aug. 25, 2011

(30) Foreign Application Priority Data

Feb. 24, 2010 (JP) ................................. 2010-039039

(51) Int. Cl.
*G06F 19/00* (2011.01)

(52) U.S. Cl.
USPC .............................. 700/112; 700/96; 700/228

(58) Field of Classification Search
USPC ...................... 414/217; 700/96, 112, 213, 228
See application file for complete search history.

(56) References Cited

U.S. PATENT DOCUMENTS

| 6,920,369 B2 * | 7/2005 | Ueno et al. ..................... 700/121 |
| 7,191,033 B2 | 3/2007 | Higashi et al. |
| 7,322,756 B2 | 1/2008 | Akimoto et al. |
| 2009/0076648 A1 | 3/2009 | Numakura et al. |

FOREIGN PATENT DOCUMENTS

| JP | 11-163087 A1 | 6/1999 |
| JP | 2005-129868 A1 | 5/2005 |
| JP | 2005-286304 A1 | 10/2005 |
| JP | 2006-203003 A1 | 8/2006 |
| JP | 2006-203075 A1 | 8/2006 |
| JP | 2009-076504 A1 | 4/2009 |
| JP | 2009-099577 A1 | 5/2009 |
| JP | 2009-164646 A1 | 7/2009 |

OTHER PUBLICATIONS

Japanese Office Action dated Apr. 26, 2012 (with English translation).

* cited by examiner

*Primary Examiner* — Carlos Ortiz Rodriguez
(74) *Attorney, Agent, or Firm* — Burr & Brown

(57) ABSTRACT

A substrate processing system, which repeats a carrying cycle in which a substrate is carried sequentially in a carrying order indicated by module numbers assigned to the modules, respectively, from the module of a lower module number to that of a higher module number, and is capable of processing substrates at a high throughput even if some modules become unusable and, thereafter, become usable. A controller controls a carrier such that the carrier carries a substrate taken out from the module preceding a multimodule unit including a plurality of modules to the module nest in the carrying order to the module of the multimodule unit from which a substrate is carried out at time nearest to time when the substrate was carried out from the module preceding the multimodule.

19 Claims, 28 Drawing Sheets

ALTERED SCHEDULE 1 (AFTER CHANGE)

☐ : USABLE MODULE
▨ : UNUSABLE MODULE
A : WAFER NUMBER
S : MODULE NUMBER

ALTERED SCHEDULE 7 (BEFORE CHANGE)

| CYCLE NUMBER | CPL | | | DEV | | | | | | HP | | | | | | TRS | |
|---|---|---|---|---|---|---|---|---|---|---|---|---|---|---|---|---|---|
| | 41 | 42 | 43 | 1 | 2 | 3 | 4 | 5 | 6 | 1 | 2 | 3 | 4 | 5 | 6 | 1 | 2 |
| 1 | A012 | | | A009 | | | | | | | | | | | | | |
| 2 | | A013 | | | A011 | A010 | | | | | | | | | | | |
| 3 | | | A014 | | | | | | | | | | A004 | A005 | A006 | | |
| 4 | A015 | | | A014 | | | | | | A007 | | | | | | A001 | A002 |
| 5 | | A016 | | | | | | A012 | | | A008 | | | | | A003 | A004 |
| 6 | | | A017 | | A016 | A015 | | | A013 | | | A009 | | | | A005 | A006 |
| 7 | A018 | | | A019 | | | | | | A013 | | | A010 | A011 | A012 | A007 | A008 |
| 8 | | A019 | | | A021 | A020 | | A017 | A018 | | A014 | | | | | A009 | A010 |
| 9 | | | A020 | | | | | | | | | A015 | A016 | A017 | A018 | A011 | A012 |
| 10 | A021 | | | A019 | | | | | | A019 | | | | | | A013 | A014 |
| 11 | | A022 | | | | | | A022 | A023 | | A020 | | | | | A015 | A016 |
| 12 | | | A023 | A024 | | A025 | | | | | | A021 | A022 | A023 | | A017 | |
| 13 | A024 | | | | | | | | | | | | | | | | |
| 14 | | A025 | | | | | | | | | | | | | | | |
| 15 | | | B001 | | B001 | | | B002 | B003 | | | | | | | | |
| 16 | B001 | | | B002 | | | | | | | | | | | | | |
| 17 | | B003 | B004 | | | | | | | | | | | | | | |
| 18 | B002 | | | | | | | | | | | | | | | | |
| 19 | | B005 | | | | | | | | | | | | | | | |
| 20 | B005 | | B006 | | | | | | | | | | | | | | |

FIG. 20

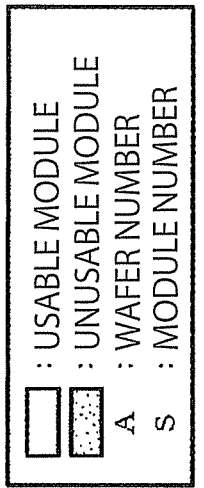
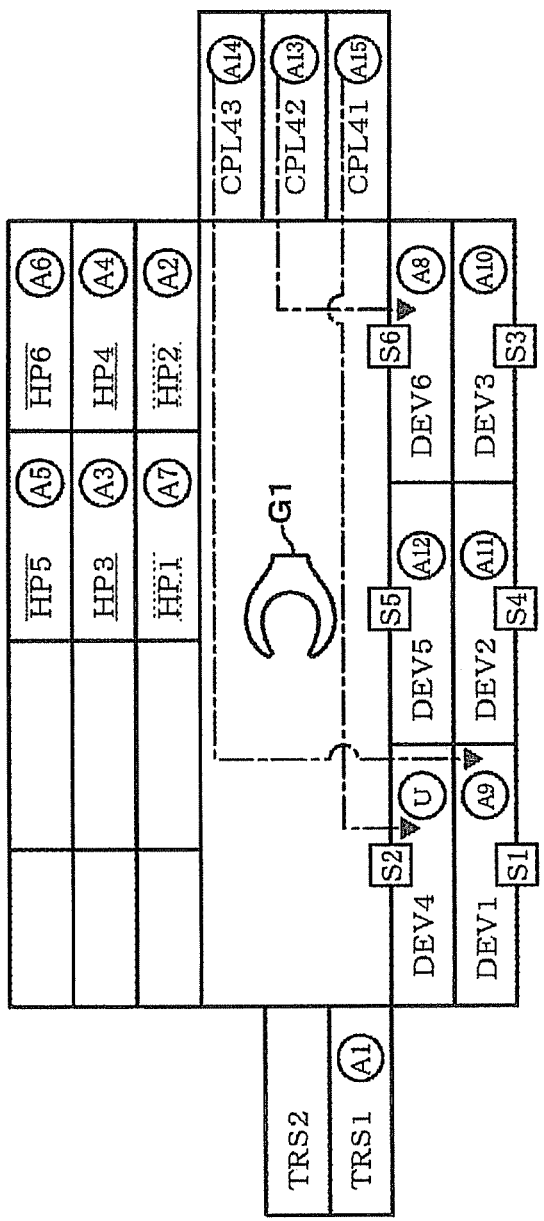
FIG. 21

ALTERED CARRYING SCHEDULE 7 (AFTER CHANGE)

CYCLE NUMBER

| ↓ | CPL | | | DEV | | | | | | HP | | | | | | TRS | |
|---|---|---|---|---|---|---|---|---|---|---|---|---|---|---|---|---|---|
| | 41 | 42 | 43 | 1 | 2 | 3 | 4 | 5 | 6 | 1 | 2 | 3 | 4 | 5 | 6 | 1 | 2 |
| 1 | A012 | | | A009 | | | | | | | | | | | | | |
| 2 | | A013 | | → | A011 | A010 | | | | | | | A004 | | | | |
| 3 | | | A014 | → | → | → | | A012 | | | | | → | A005 | | A001 | |
| 4 | A015 | | | A014 | → | → | → | → | A013 | | | | → | → | A006 | | A002 |
| 5 | | A016 | | → | A017 | A016 | A015 | → | → | A007 | → | → | → | → | → | A003 | ABORT |
| 6 | | | A017 | → | → | → | → | A018 | → | → | A008 | → | → | → | → | A004 | A005 |
| 7 | A018 | | | A018 | → | → | → | → | A019 | → | → | A009 | → | → | → | A006 | |
| 8 | | A019 | | → | A020 | A022 | A021 | → | → | A013 | → | → | A010 | A011 | A012 | | A007 |
| 9 | | | A020 | → | → | → | → | A024 | → | → | A014 | → | → | → | → | A008 | |
| 10 | A021 | | | A020 | A023 | A022 | | | A025 | A019 | → | A015 | A016 | A017 | A018 | A010 | A009 |
| 11 | | A022 | | → | → | → | A021 | A024 | → | → | → | → | → | → | → | A012 | A011 |
| 12 | | | A023 | → | → | → | → | → | → | → | → | → | → | → | → | | A013 |
| 13 | A024 | | | → | → | → | → | → | → | → | A020 | A021 | A022 | → | → | A014 | |
| 14 | | A025 | | → | → | → | → | → | → | → | → | → | → | → | → | | A015 |
| 15 | | | B001 | B001 | → | → | B002 | → | → | A019 | A020 | → | → | → | → | A016 | |
| 16 | B002 | | | → | → | B003 | → | → | → | → | → | → | → | → | → | | |
| 17 | | B003 | | → | → | → | → | → | → | → | → | → | → | → | → | | |
| 18 | | | B004 | → | → | → | → | → | → | → | → | → | → | → | → | | |
| 19 | B005 | | | → | → | → | → | → | → | → | → | → | → | → | → | | |
| 20 | | B006 | | → | → | → | → | → | → | → | → | → | → | → | → | | |

FIG. 22

ND STORAGE MEDIUM

SUBSTRATE PROCESSING SYSTEM, SUBSTRATE PROCESSING METHOD AND STORAGE MEDIUM

BACKGROUND OF THE INVENTION

1. Field of the invention

The present invention relates to a substrate processing system, a substrate processing method and a storage medium. The substrate processing system has modules capable of holding a substrate. Module numbers indicating carrying order are assigned to the modules, respectively. Substrates are carried sequentially to the modules in the carrying order of increasing module number to subject the substrates to predetermined processes.

2. Description of the Related Art

A coating and developing system for forming a resist pattern on a substrate has a carrier block to which a substrate carrier, namely, a carrying container for carrying substrates, is delivered, a processing block including a resist film forming block for forming a resist film on a substrate and a developing block for processing a substrate processed by an exposure process, and an interface block connected to an exposure system. A structure mentioned in, for example, Patent document 1 is formed by stacking up a an antireflection film forming for forming an antireflection film on a substrate, a resist film forming block for forming a resist film on a substrate in a vertical arrangement and putting a developing block for processing a substrate by a developing process on the stack of the antireflection film and the resist film forming block.

A horizontal, straight carrying passage is formed in each block of such a coating and developing system, and processing modules are arranged on both sides of the carrying passage. Each block is provided with transfer modules for receiving a substrate and transfer modules for sending out a substrate processed by a series of processes in the block. Carrying order of carrying substrates to those modules is determined. A carrying means provided with two or more arms takes out a substrate from a preceding module, receives a substrate from a succeeding module and transfers the substrate taken out from the preceding module to the succeeding module. Thus, a substrate is transferred from the preceding module to the succeeding module in one carrying cycle. The carrying means repeats the carrying cycle. In some cases, the modules include a multimodule unit including three or more modules identified by the same module number and having the same processing function to enhance throughput.

Sometimes, some of the modules of the multimodule unit becomes unusable due to the malfunction or the maintenance of mechanisms. If some module becomes unusable while the coating and developing system is in operation, the unusable module needs to be excluded from a carrying schedule. If a substrate is held in the excluded, unusable module, it becomes a problem how to take out the substrate from the coating and developing system and how to incorporate the module into the carrying schedule when the excluded, unusable module becomes usable.

A technique mentioned in Patent document 2 transfers, when a module becomes unusable, a substrate held in a module preceding the unusable module to a buffer module. The number of buffer modules needed by this technique must be equal to the expected number of unusable modules. Nothing about measures to deal with a substrate held in the buffer module is mentioned in Patent document 2.

Patent document 1: JP-A 2009-099577
Patent document 1: JP-A 2006-203003

SUMMARY OF THE INVENTION

Accordingly, it is an object of the present invention to provide a technique that enables a substrate processing system, which repeats a carrying cycle in which a substrate is carried sequentially in carrying order indicated by module numbers assigned to the modules, respectively, from the modules of lower module numbers to those of higher module numbers to process substrates at a high throughput even if some module becomes unusable and, thereafter, becomes usable.

According to the present invention, a substrate processing system includes: modules capable of holding a substrate therein and identified by module numbers indicating numerical carrying order in which substrates are carried to the modules and including multimodule units each including three or more modules identified by the same module number and built to execute the same process; a first carrying means that takes out a substrate from the preceding module, transfers the same substrate to the succeeding module after receiving a substrate from the succeeding module in one carrying cycle, and executes one carrying cycle after another to carry substrates sequentially from the modules identified by lower module numbers to those identified by higher module numbers to subject the substrates to predetermined processes; substrates being carried in predetermined carrying order to the modules of the multimodule unit from the module preceding the multimodule unit in a normal state, distribution numbers indicating distribution order in which substrates are distributed to the modules of the multimodule unit being assigned to the modules of the multimodule unit, and a substrate being delivered to a first module identified by the lowest distribution number among the modules of the multimodule unit after a substrate has been delivered to the last module identified by the highest distribution number in the multimodule unit; a storage device storing a carrying schedule formed by arranging carrying cycle data specifying carrying cycles by matching numbers assigned to the substrates and the modules in a time series; and a controller for controlling the first carrying means to make the first carrying means execute a carrying cycle such that substrates written to the carrying cycle data are carried to the corresponding modules, respectively; wherein the controller controls the first carrying means such that the first carrying means carries a substrate taken out from the module preceding the multimodule unit including the plurality of modules to the module next in carrying order to the module of the multimodule unit from which a substrate is carried out at time nearest to time when the substrate was carried out from the module preceding the multimodule upon the change of a state where at least one of the modules of the multimodule unit is unusable and the rest are usable into a state where all the modules of the multimodule unit are usable.

In the substrate processing system according to the present invention, a second carrying means takes out a substrate from the module at a downstream end among the modules, and the controller controls, when a substrate carried out from the module preceding the multimodule unit is to be carried into the unusable module and a substrate is held in the unusable module, the second carrying means to carry the substrate by the second carrying means. The substrate held in the unusable module is carried to the module at the downstream end.

In the substrate processing system according to the present invention, the modules capable of holding a substrate and identified, respectively, by module numbers indicating numerical carrying order in which substrates are carried to the modules are included in a coating and developing system for coating a substrate with a resist and developing a latent image formed on a substrate by an exposure process and are those for forming films on a substrate before the substrate is subjected to the exposure process.

In the substrate processing system according to the present invention, the modules capable of holding a substrate and identified, respectively, by module numbers indicating numerical carrying order in which substrates are carried to the modules are included in a coating and developing system for coating a substrate with a resist and developing a latent image formed on a substrate by an exposure process and are those for processing a substrate by processes, including a developing process, to be executed after the exposure process.

The first carrying mechanism for carrying a substrate to the modules for forming a film on a substrate before the exposure process may move along a first horizontal, straight carrying passage, the second carrying mechanism for carrying a substrate to the modules for processing a substrate processed by an exposure process by processes including a developing process may move along a second horizontal, straight carrying passage.

A substrate processing method according to the present invention to be carried out by a substrate processing system including modules capable of holding a substrate and identified, respectively, by module numbers indicating numerical carrying order in which substrates are carried to the modules, and including multimodule units each including three or more modules identified by the same module number and capable of executing the same process, a first carrying means which takes out a substrate from the preceding module and transfers the substrate to the succeeding module after receiving a substrate from the succeeding module in one carrying cycle and repeats the carrying cycle sequentially to carry substrates sequentially from the modules identified by lower module numbers to those identified by higher module numbers to subject the substrate to predetermined processes; substrates being distributed in predetermined distribution order to the modules of the multimodule unit in a normal state, distribution numbers indicating distribution order being assigned to the modules of the multimodule unit, respectively, a substrate being delivered to the first module of the multimodule unit after a substrate has been delivered to the last module of the multimodule unit; includes the steps of executing the carrying cycle with reference to a carrying schedule including numbers assigned to substrates and carrying cycle data arranged in a time series specifying the numbers of the substrates and the corresponding modules by controlling the first carrying means to make the first carrying means execute the carrying cycle such that the substrates written to the carrying cycle data are carried to the corresponding modules, respectively; and controlling the first carrying means by a controller such that a substrate taken out from the module preceding the multimodule unit is carried to the module of the multimodule unit next to the module of the multimodule unit in carrying order from which a substrate is taken out at time nearest to time when the substrate was taken out from the preceding module upon the change of a state where at least one of the modules of the multimodule unit is unusable and the rest are usable into a state where all the modules of the multimodule unit are usable.

For example, a second carrying means transfers a substrate to the module at a downstream end among the modules.

The substrate processing method further includes the step of taking out a substrate held in the unusable module by the second carrying means for carrying a substrate to the module at a downstream end among the modules when a substrate taken out from the module preceding the multimodule unit is to be carried to the unusable module and carrying the same substrate to the module ready to receive a substrate.

In the substrate processing method according to the present invention, the destination of the substrate held in the unusable module is the module at the downstream end and the modules capable of holding a substrate and identified by the module numbers, respectively, may be those included in a coating and developing system for coating a substrate with a resist and developing a latent image formed on a substrate by an exposure process and those for forming a film on a substrate before the substrate is subjected to the exposure process.

In the substrate processing method according to the present invention, the modules capable of holding a substrate and identified by the module numbers, respectively, may be included in a coating and developing system for coating a substrate with a resist and developing a latent image formed on a substrate by an exposure process, and may be those for processing a substrate by processes, including a developing process, to be executed after the exposure process.

A storage medium according to the present invention stores a computer program to be executed by a substrate processing system provided with modules capable of holding a substrate and identified by module numbers, respectively, and carries a substrate to the modules in numerical carrying order indicated by the module numbers to process the substrate by predetermined processes, wherein the computer program is a set of instructions to be executed in the steps of the substrate processing method.

According to the present invention, when at least one unusable module of the multimodule unit becomes usable, a substrate taken out from the module preceding the multimodule unit is not carried directly to the module that has just become usable and is carried in the carrying order in which a substrate is carried to the modules of the multimodule unit. Consequently, increase in the number of the carrying cycles and decrease in throughput can be suppressed.

BRIEF DESCRIPTION OF THE DRAWINGS

FIG. 13 is a schematic view of assistance in explaining a normal carrying schedule for carrying wafers in a COT layer;

FIG. 16 is a carrying schedule table for the DEV layer;

FIG. 18 is a carrying schedule table for the DEV layer;

FIG. 20 is a carrying schedule table for the DEV layer;

FIG. 21 is a schematic view of assistance in explaining an altered carrying schedule for carrying wafers in a DEV layer;

FIG. 22 is a carrying schedule table for the DEV layer;

DETAILED DESCRIPTION OF THE INVENTION

Figure 1:
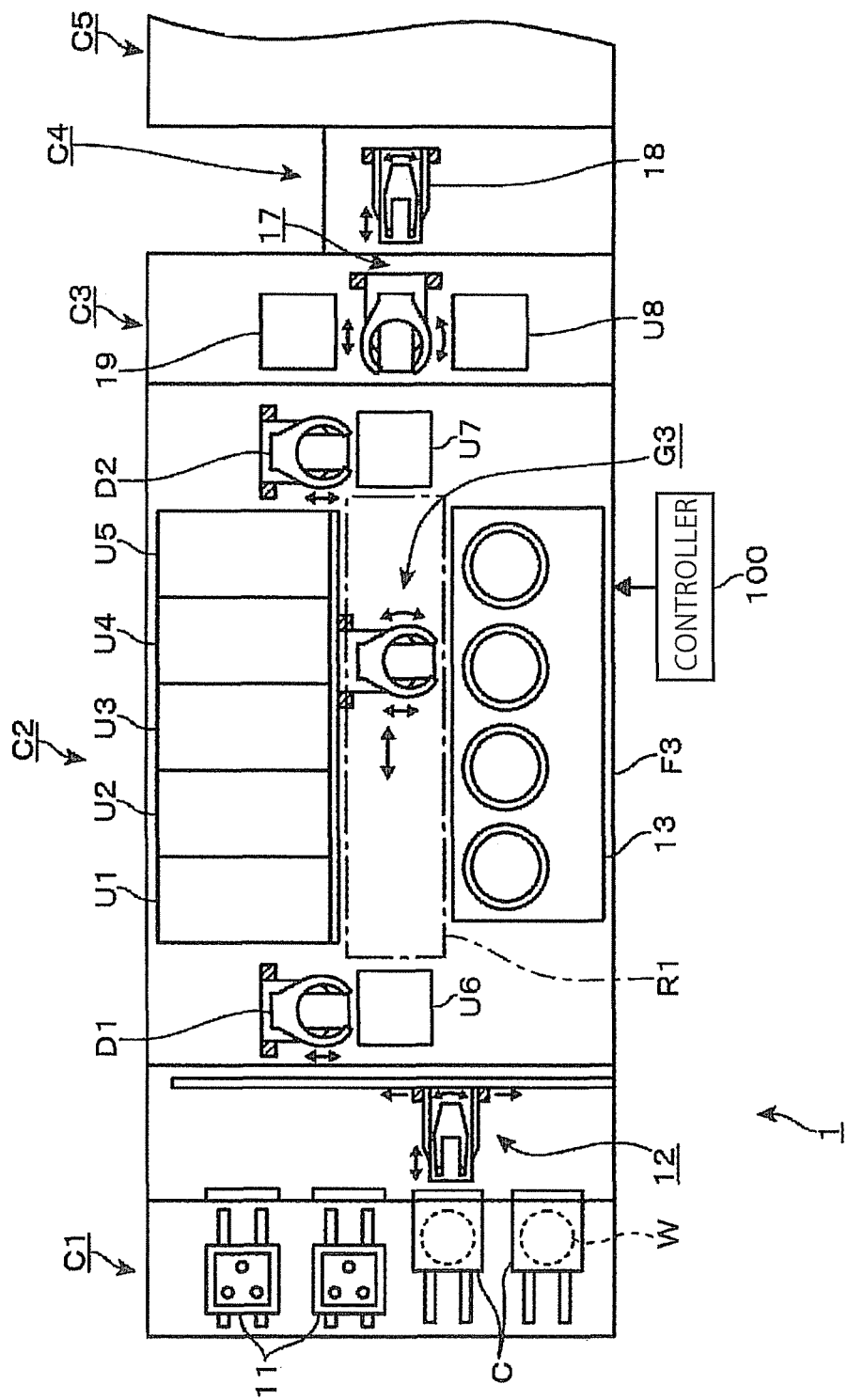
FIG. 1 is a schematic plan view of a coating and developing system according to the present invention.
Figure 2:
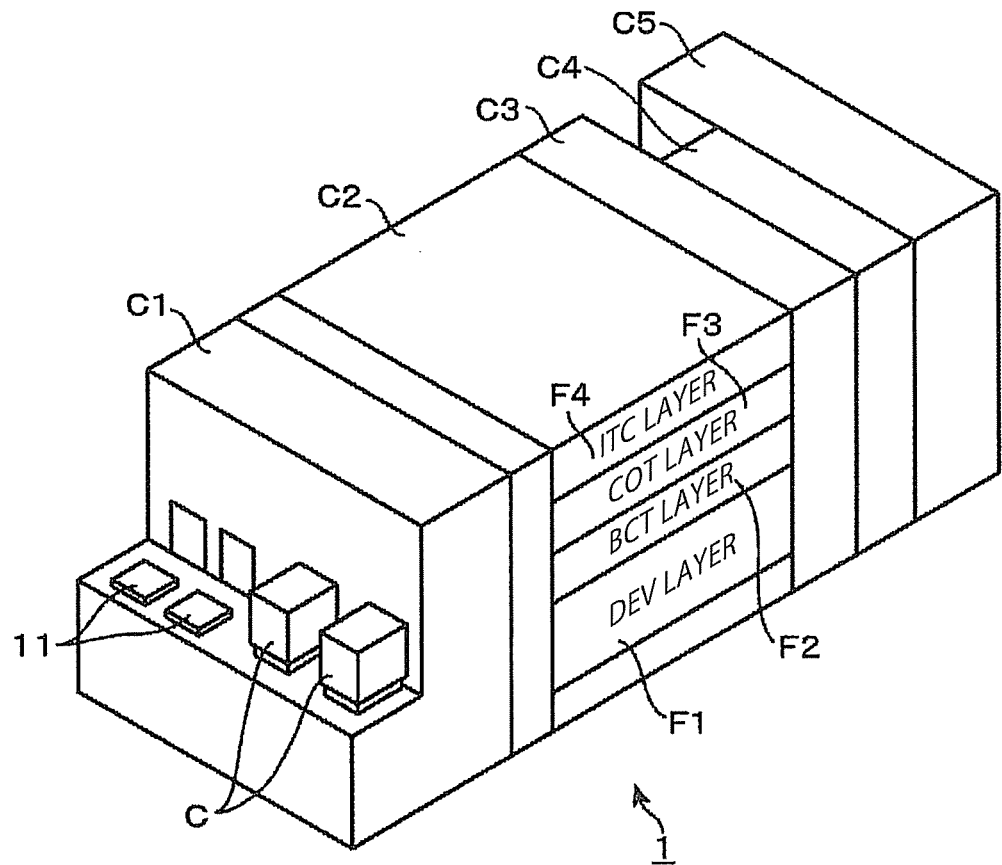
FIG. 2 is a schematic perspective view of the coating and developing system shown in FIG. 1.
Figure 3:
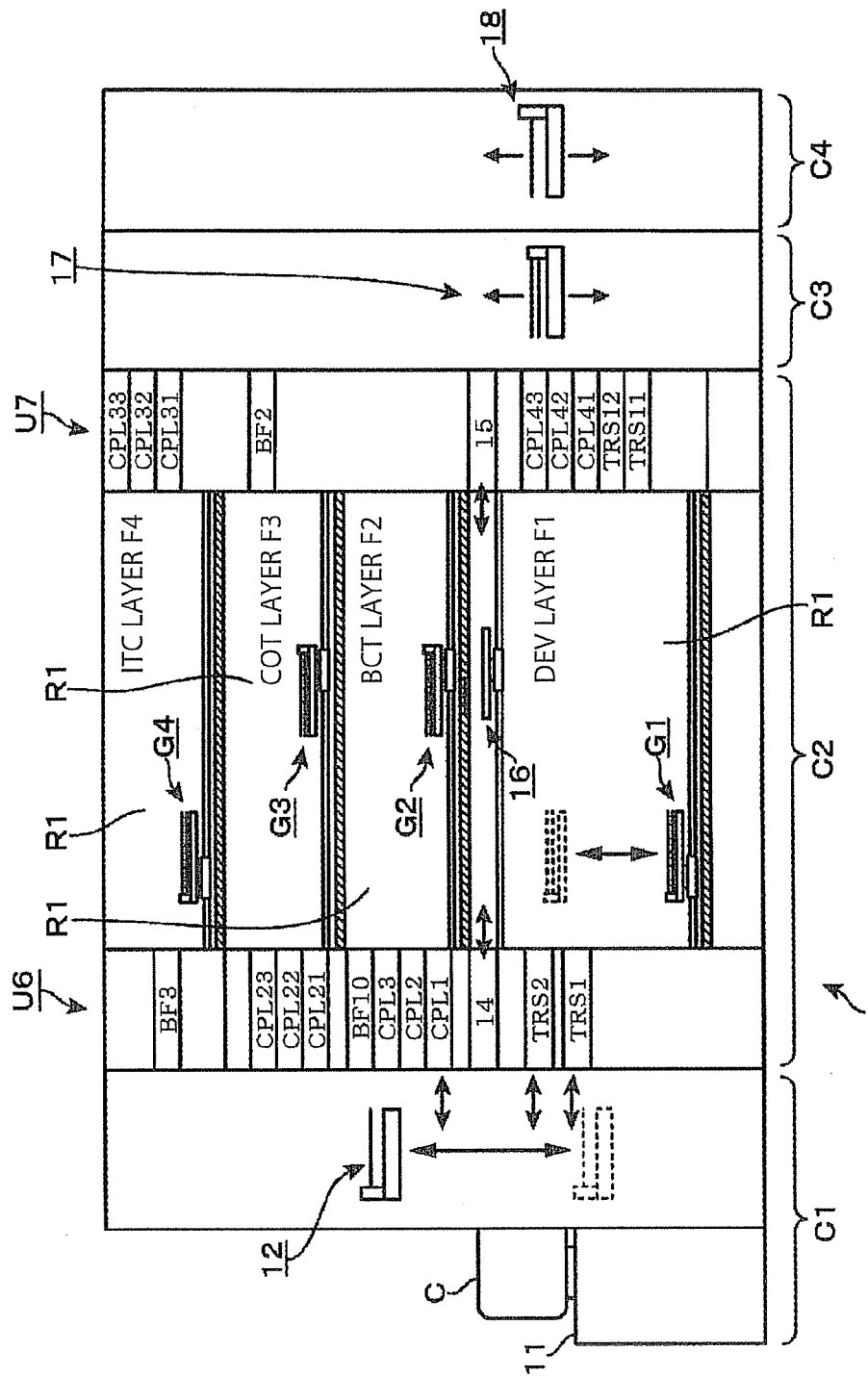
FIG. 3 is a schematic longitudinal sectional view of the coating and developing system shown in FIG. 1.

The constitution of a coating and developing system 1, namely, a substrate processing system, of the present invention and a carrying route in the coating and developing system 1 will be described. The carrying route is taken when modules of the coating and developing system 1 are normally usable. The modules are processing devices for processing a semiconductor wafer W (hereinafter, referred to simply as "wafer. W"). FIG. 1 is a schematic plan view of the coating and developing system 1 combined with an exposure system C5 to form a resist pattern forming system. FIG. 2 is a schematic perspective view of the resist pattern forming system. FIG. 3 is a schematic longitudinal sectional view of the resist pattern forming system. The coating and developing system 1 has a carrier block C1. An airtight carrier C is placed on a carrier table 11 disposed in the carrier block C1. A transfer arm 12 takes out a wafer W from the carrier C and transfers the same to a processing block C2. The transfer arm 12 receives a processed wafer W from the processing block C2 and returns the same to the carrier C. The carrier C is provided with shelves for supporting a plurality of wafers W thereon.

Referring to FIG. 2, the processing block C2 has a first block F1 (DEV layer F1) for processing a wafer W by a developing process, a second block F2 (BCT layer F2) for forming an antireflection film beneath a resist film, a third block F3 (COT layer F3) for forming a resist film, and a fourth block F4 (ITC layer F4) for forming a protective film on a resist film. The blocks F1, F2, F3 and F4 are stacked up in that order.

The layers of the processing block C2 are the same in a plan. The third block F3, namely, the COT layer F3, shown in FIG. 1 will be described by way of example. The COT layer F3 has a resist film forming unit 13 for forming a resist film, shelf units U1 to U5 each provided with a heating module, and a carrying arm G3 disposed between the resist film forming unit 13 and the row of the shelf units U1 to U5 to carry a wafer from and to the film forming unit 13 and the shelf units U1 to U5.

The resist film forming unit 13 has four resist solution application modules COT1 to COT4. The shelf units U1 to U5 are arranged along a carrying area R1, namely, a horizontal, straight carrying passage, and each of the shelf units U1 to U4 is formed by stacking up the heating modules. Each of the shelf units U1 to U4 is formed by stacking up the two of eight heating modules HP1 to HP8. The heating modules HP1 to HP8 heats a wafer W coated with a resist solution.

The fourth block F4 (the ITC layer F4) and the second block F2 (the BCT layer F2) have protective film forming modules similar to the resist film forming modules, and antireflection film forming modules, respectively. The BCT layer F2 and the ITC layer F4 are similar in construction and function to the COT layer F3, except that the BCT layer F2 and the ITC layer F4 apply a chemical solution for forming an antireflection film and a chemical solution for forming a protective film, respectively, to a wafer W instead of a resist solution.

The first block F1 (DEV layer F1) has two developing units 20 similar to the resist film forming unit 13 and put one on top of the other. Each of the developing units 20 has four developing modules DEV1 to DEV4. Thus, the DEV layer F1 has eight developing modules DEV1 to DEV8. The DEV layer F1, similarly to the COT layer F3, has shelf units U1 to U5 each having three heating modules stacked up in three layers. Some of the heating modules of the shelf units U1 to U5 are used for heating a wafer W processed by an exposure process prior to subjecting the wafer W to a developing process and the rest are used for heating a wafer W processed by a developing process. In this embodiment, the heating modules HP1 to HP9 of the shelf units U3 to U5 are used for heating a wafer W processed by a developing process.

Figure 4:
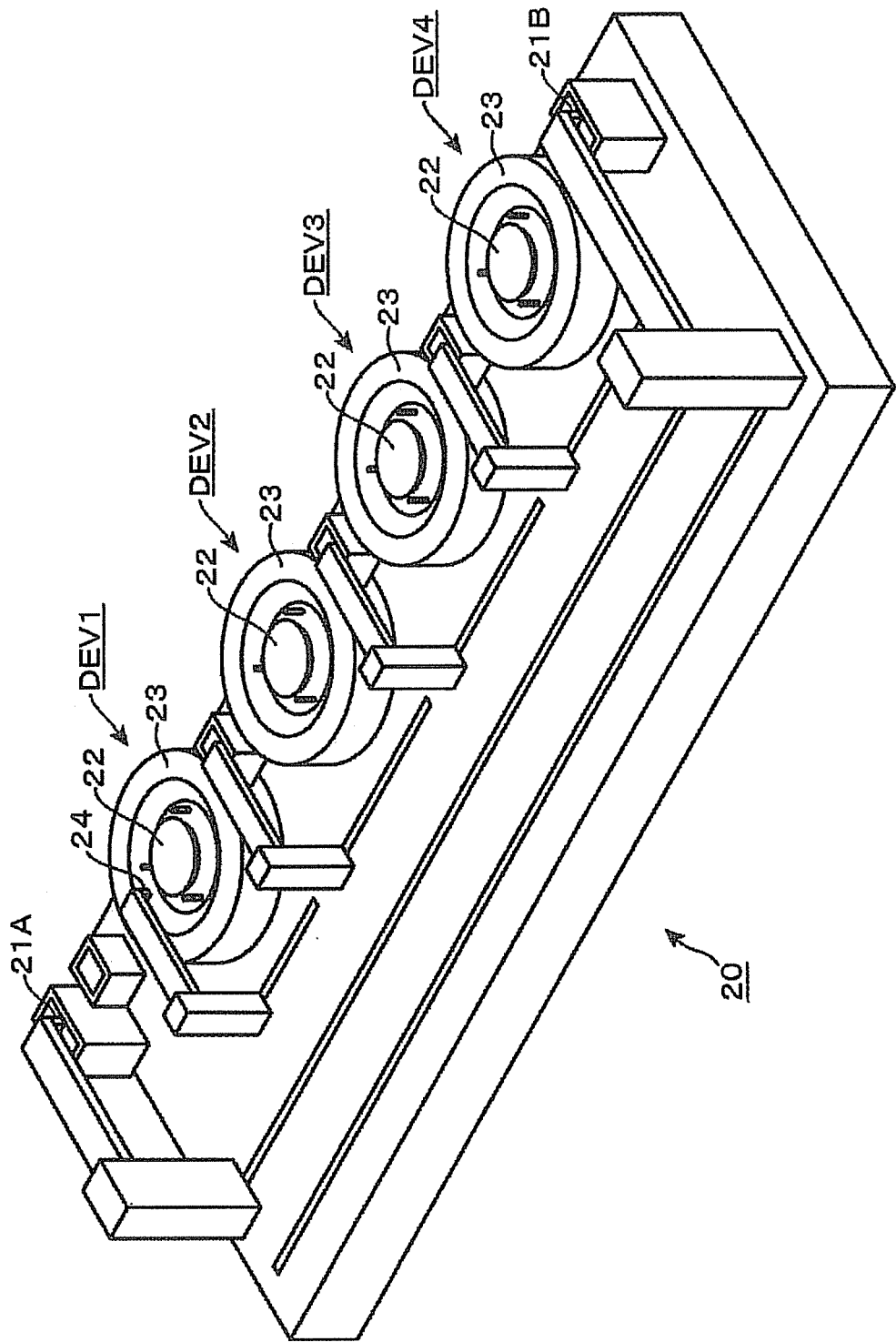
FIG. 4 is a schematic perspective view of a developing unit included in the coating and developing system shown in FIG. 1.

The constitution of the developing units 20 will be described with reference to FIG. 4. As mentioned above, the developing units 20 are put one on top of the other. The lower developing unit 20 is shown in FIG. 4. The developing unit 20 has the four developing modules DEV1 to DEV4 and two developer pouring nozzles 21A and 21B for pouring a developer. The developer pouring nozzles 21A and 21B operate independently to pour the developer in the developing modules DEV1 to DEV4 for a developing process. The four developing modules DEV1 to DEV4 use the two developer pouring nozzles 21A and 21B in common. For example, the developer pouring nozzle 21A and the developer pouring nozzle 21B may be used for pouring the developer in the developing modules DEV1 and DEV2 and in the developing modules DEV3 and DEV4, respectively.

Each of the developing modules DEV1 to DEV4 is provided with a spin chuck 22 capable of holding a wafer W thereon and of rotating about a vertical axis, a cup 23 surrounding the spin chuck 22, and a cleaning nozzle 24 for cleaning a wafer W wetted with the developer. In FIG. 4, only one of the four cleaning nozzles 24 is at a working position. The upper developing unit 20 is similar in construction to the lower developing unit 20. The developing modules DEV5 to DEV8 of the upper developing module 20 use two developer pouring nozzles 21C and 21D in common. For example, the developer pouring nozzle 21C and the developer pouring nozzle 21D may be used for pouring the developer in the developing modules DEV5 and DEV6 and in the developing modules DEV7 and DEV8, respectively.

The resist film forming unit 13 is substantially similar in construction to the developing unit 20. The resist solution application modules COT1 to COT4 use one resist solution pouring nozzle in common. Each of the resist solution application modules COT1 to COT4 is provided with an edge trimming nozzle for pouring a solution to remove an edge part of a resist film.

Returning again to the description of the DEV layer F1, the DEV layer F1 is provided with a carrying arm G1 for carrying a wafer W to the developing modules DEV1 to DEV8 included in the two developing units 20 stacked up in two layers and to the heating modules. The two developing units 20 use the carrying arm G1 in common.

As shown in FIGS. 1 and 3, a shelf unit U6 is installed in the processing block C2. Wafers W received from the carrier block C1 are transferred sequentially to one of the transfer modules of the shelf unit U6, for example, to one of transfer modules CPL1 to CPL3 of the second block F2, namely, the BCT layer F2. A carrying arm G2 placed in the second block F2 (BCT layer F2) receives wafers W from the transfer modules CPL1 to CPL3 and carries the wafers W to the antireflection film forming modules and carries the wafers W coated with an antireflection film to the heating modules. Thereafter, the carrying arm G2 carries the wafer to a transfer module BF10 of the shelf unit U6. A vertically movable transfer arm D1 carries the wafers W transferred to the transfer module BF10 sequentially to one of transfer modules CPL21 to CPL23 of the shelf unit U6 at a height corresponding to the third block F3 (COT layer F3). A carrying arm G3 placed in the third block F3 (COT layer F3) receives the wafer W from one of the transfer modules CPL21 to CPL23 and carries the wafer W to one of the resist solution application modules COT1 to COT4. The carrying arm G3 carries the wafer W coated with a resist film to one of the heating modules HP1 to HP8.

The carrying arm G3 carries the wafers W processed by a heating process in the heating modules HP1 to HP8 to a transfer module BF2 of the shelf unit U7. Then, a vertically movable transfer arm D2 carries the wafer W coated with a resist film to one of transfer modules CPL31 to CPL33 at a height corresponding to the fourth block F4 (ITC layer F4) and included in the shelf unit U7. A carrying arm G4 carries the wafer W to the ITC layer F4. A protective film forming module equivalent to the resist solution application module forms a protective film for immersion exposure on the resist film. The carrying arm G4 carries the wafer W to the heating module and then carries the wafer W to a transfer module BF3 of the shelf unit U6.

A shuttle carrier 16 is placed in an upper space in the DEV layer F1. The shuttle carrier 16 carries a wafer W from a transfer unit 14 included in the shelf unit U6 directly to a transfer unit 15 included in the shelf unit U7. A wafer W provided with a protective film is transferred from the transfer module BF3 to the transfer unit 14 by the transfer arm D1, and then the wafer W is transferred to the shuttle carrier 16. The shuttle carrier 16 carries the wafer W to the transfer unit 15 of the shelf unit U7. A carrying arm 17 placed in an auxiliary block C3 receives the wafer W from the transfer unit 15, carries the wafer W to a transfer module included in a shelf unit U8. Then, an interface arm 18 placed in an interface block C4 receives the wafer W and carries the same into the interface block C4. In FIG. 3, transfer modules denoted by CPL serve also as cooling modules for temperature control, and transfer modules denoted by BF serve also as buffer modules capable of holding a plurality of wafers W.

Subsequently, the interface arm 18 carries the wafer W to the exposure system C5. The exposure system C5 processes the wafer W by, for example, an immersion exposure process. The wafer W processed by the exposure system C5 is carried via the interface arm 18, the transfer module of the shelf unit U8 and the carrying arm 17 in that order. The carrying arm 17 carries the wafer W to a protective film removing module 19 included in the auxiliary block C3 to remove the protective film from the wafer W. Subsequently, the carrying arm 17 carries the wafer W to either of the transfer modules TRS11 and TRS12 of the shelf unit U7. Then, the carrying arm G1 of the first block F1 (DEV layer F1) carries the wafer W to the heating module of the shelf unit U1 or U2 to subject the wafer W to a heating process, namely, a postexposure baking process.

Thereafter, the carrying arm G1 carries the wafer W to either of transfer modules CPL41 and CPL42 included in the shelf unit U7, and then the wafer W is subjected to a developing process in one of the developing modules DEV1 to DEV8. Then, the wafer W is subjected to a heating process in one of the heating modules HP1 to HP8. Then, the carrying arm G1 transfers the wafer W processed by the heating process to either of transfer modules TRS1 and TRS2 of the shelf unit U6. Then, the transfer arm 12 returns the wafer W to the original position of the wafer W in the carrier C.

A controller 100 controls the functional parts of the coating and developing system 1 to carry out desired operations. For example, the controller 100 is a computer provided with a program storage unit, not shown. The program storage unit stores, for example a software program including instructions for the controller 100 to execute to carry out the foregoing and the following carrying operations in carrying cycles. The controller reads the program from the program storage unit and sends control signals to the components of the coating and developing system 1. Thus, the operations of the modules and wafer transfer operations for transferring a wafer W from one to another of module are controlled. The program is stored in a storage medium, such as a hard disk, a compact disk, a magnetooptical disk or a memory card, held in the program storage unit The heating modules, the resist solution application modules COT and the developing modules DEV of the processing block C2 process one wafer W at a time. Each of the carrying arms G placed in the layers of the processing block C2 is provided with two forked wafer holders capable of independently accessing the modules. Each, of the two forked wafer holders can hold a wafer W.

The operation of the carrying arm G will be described in detail. Suppose that the carrying arm G is in a state where one of the wafer holders, namely, a first wafer holder, is vacant and the other, namely, a second wafer holder, is holding a wafer W and the carrying arm G is at a position in front of a module. The vacant first wafer holder of the carrying arm G takes out a wafer W from the module and the wafer W held by the second wafer holder is placed in the module. Then, the carrying arm G moves to another module to transfer the wafer W held by the first wafer holder to the module.

The carrying arm G of each layer moves wafers W one at a time from the module to the next modules in numerical carrying order. The carrying arm G executes carrying cycles sequentially. Thus, wafers W taken out earlier from the carrier C are always in modules identified by higher numbers and those taken out later from the carrier C are in modules identified by lower numbers, and the wafers W are transferred sequentially from the module to the module in numerical carrying, order in which the wafers W are carried to the modules. The carrying arms G of the layers of the processing block C2 thus operate independently.

The controller 100 assigns wafer numbers indicating numerical carrying order to the wafers W. The wafers W are carried into the coating and developing system 1 in the numerical carrying order. In this description, wafers W of the same kind taken out from the carrier C will be called wafers A of a lot A, wafers W of the same kind taken out from a subsequent carrier C will be called wafers B of a lot B and the controller 100 assigns wafer numbers indicating numerical carrying order in which the wafers W are taken out from a carrier C to the wafers W of each of the lot A, the lot B and succeeding lots. More concretely, the controller assigns wafer numbers A1, A2, A3, . . . and An indicating numerical carrying order in which the wafers W of the lot A are carried into the coating and developing system 1 to the wafers W of the lot A.

The controller 100 sends control signals to the wafer carrying means including the carrying arms G of the coating and developing system 1 on the basis of a carrying schedule to make the wafer carrying means carry wafers W to the modules. The carrying schedule includes wafer numbers indicating carrying order assigned to the wafers W and carrying cycle data on carrying cycles (phases) determined by specifying the correspondence of the wafer numbers of the wafers W to the modules and arranged in a time series. The carrying schedule is stored, for example, in a storage device included in the controller 100.

Wafers W are carried in the above-mentioned carrying mode in the coating and developing system 1. If trouble arises in the module or when the module needs maintenance, the wafer W cannot be carried into that module. The module into which the wafer W cannot be carried will be called an intended excluded module. When the module is unusable, wafers W are carried according to an altered carrying schedule obtained by altering the original carrying schedule. A carrying mode according to the altered carrying schedule different from the original carrying schedule will be called a special carrying mode. The module to which any wafer W is not carried in the special carrying mode will be called an excluded module (unusable module). The operator can choose either automatic special carrying mode start that is executed automatically or manual special carrying mode start hat is executed in response to an instruction provided by the operator. A wafer W held in the intended excluded module or the excluded module will be called a left wafer U.

A group of the modules that process wafers W by the same process at the same stage, for example, the resist solution application modules COT1 to COT4, will be called a multimodule unit. Wafers W are carried sequentially to the component modules of the multimodule unit in predetermined carrying order. After a wafer W has been carried into the last one of the modules of the multimodule unit, wafers W are carried into the first to the last module in that order.

The nozzles installed in the resist solution application modules COT and the developing modules DEV execute a dummy chemical solution spouting operation which is not intended to process a wafer W. Each nozzle executes the dummy chemical solution spouting operation at predetermined intervals. The dummy chemical solution spouting operation is executed when the lots of wafers W to be processed are changed.

A cleaning process is executed for the resist solution application modules COT and the developing modules DEV to clean the cups, the nozzles and exhaust ducts. Exhaust ducts of the heating modules are cleaned. The cleaning process is executed, for example, at predetermined intervals for each module. Effects of the cleaning process and the dummy chemical solution spouting operation on a wafer carrying operation will be described in the following explanation of carrying rules.

A carrying route to be taken for carrying a wafer W when an excluded, unusable module is restored to a usable state and a wafer W can be carried to the module will be described. It is one of the carrying rules to carry a wafer W which is not subjected to an expected process (step) to be executed by the excluded module first at the restart of the carrying operation upon the restoration of the excluded module to a usable state that permits carrying a wafer W to the module; that is, a wafer W which has not been carried to the multimodule unit including the excluded module restored to a usable state is carried to the excluded module. If conditions for executing the dummy chemical solution spouting operation or the cleaning process are met when the unusable module is restored to a usable state, a carrying operation for carrying a wafer W to the module is resumed after completing the dummy chemical solution spouting operation or the cleaning process.

It is one of the rules to carry a wafer W to the multimodule unit including the excluded module in predetermined carrying order even if the excluded module is restored to a usable state and a wafer W can be carried to the module restored to a usable state; that is, a wafer W carried out from the module preceding the multimodule unit is carried in predetermined carrying order set for the multimodule unit to the module next to the module to which a wafer W preceding the said wafer W has been carried in the multimodule unit. Therefore, a wafer W is not necessarily carried to the module once excluded and restored to a usable state immediately after the excluded module has been restored to a usable state and a wafer W is not carried to the once excluded and restored to the usable state as soon as the excluded module is restored to a usable state depending on time when the excluded module is restored to a usable state.

It is a carrying rule to carry wafers W not carried to the multimodule unit including the excluded module so as to use all the usable multimodule units upon the restoration of the excluded module to a usable state; that is, wafers W are carried such that all the usable multimodal units are used. According to this carrying rule, a wafer is carried to the module whether or not there is a left wafer U in that module. However, if the module restored to a usable state is in a condition for executing the dummy chemical solution spouting operation or the cleaning process, a carrying operation for carrying a wafer W to that module is resumed after the dummy chemical solution spouting operation or the cleaning process has been completed.

Figure 5:
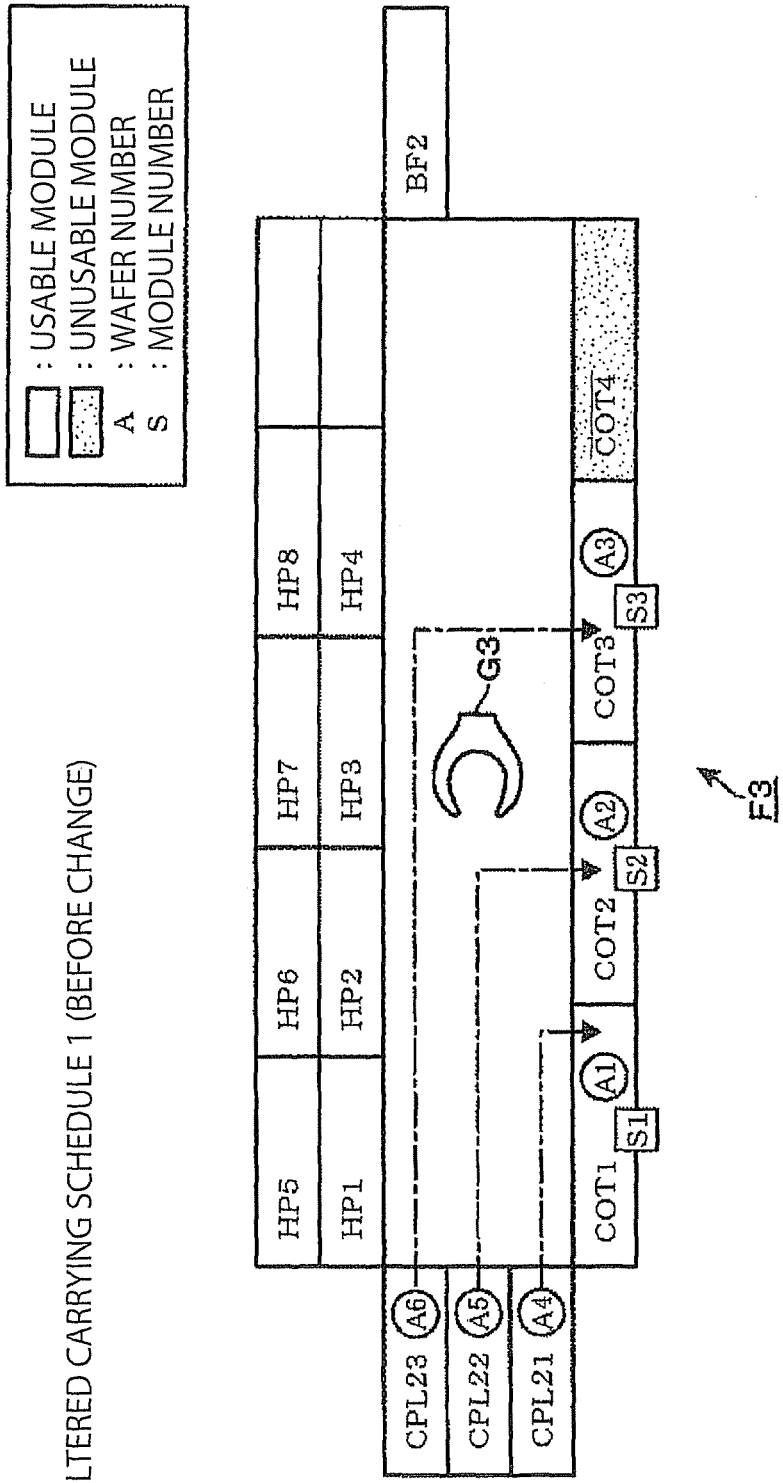
FIG. 5 is a schematic view of assistance in explaining a normal carrying schedule for carrying wafers in a COT layer.

Altered carrying schedules formed by altering the original carrying schedule in conformity to those rules will be concretely described with reference to the accompanying drawings. FIG. 5 is a planar development showing the modules of the COT layer F3. When wafers W are not carried in the special carrying mode in the COT layer F3, wafers W are carried sequentially to COT1, COT2, COT3 and COT4 in that order. Similarly, wafers W are carried in order of numbers assigned to the heating modules when wafers W are not carried in the special carrying mode to the heating modules.

Altered Carrying Schedule 1

In FIG. 5, trouble has arisen in the resist solution application module COT4 and, therefore, the resist solution application module COT4 is an excluded resist solution application module. Therefore, wafers W are carried in the special carrying mode. In the special carrying mode, wafers W are carried sequentially to the COT1, COT2 and COT3 in that order in carrying cycles. In the drawings following FIG. 5, excluded modules are shaded with dots. In the drawings, numbers prefixed with S indicate carrying order in which wafers W are carried in the multimodule unit. In the COT layer F3 shown in FIG. 5, wafers A1, A2 and A3 are placed, respectively, in the resist solution application modules COT1, COT2 and COT3 and wafers A4, A5 and A6 have been delivered, respectively, to the transfer modules CPL21, CPL22 and CPL23. Since the resist solution application module COT4 is unusable, a carrying schedule is formed such that the wafers A4, A5 and A6 are carried sequentially, respectively, to the resist solution application modules COT1, COT2 and COT3 in increasing order of numbers as indicated by the arrows.

Figure 6:
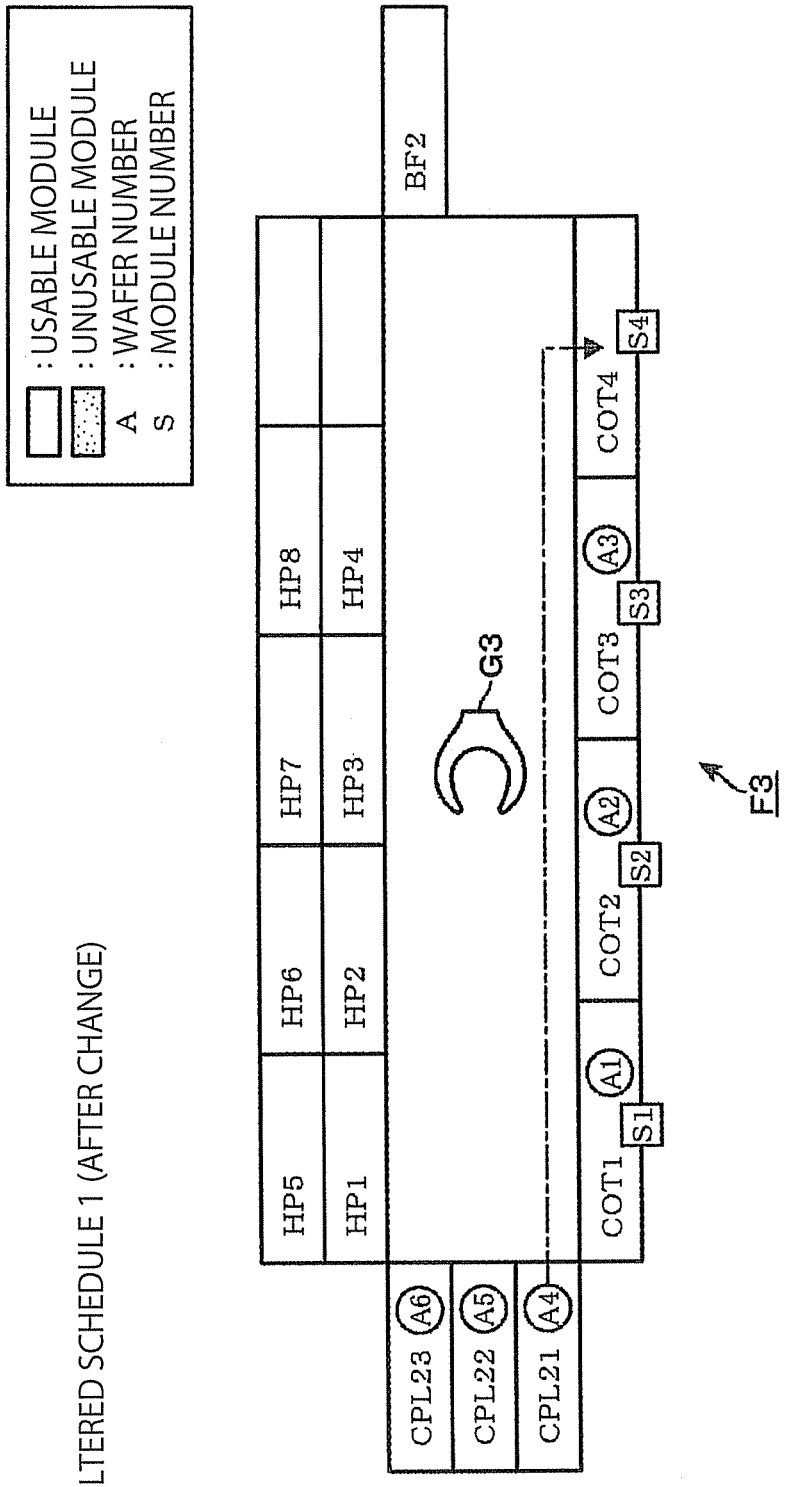
FIG. 6 is a schematic view of assistance in explaining an altered carrying schedule for carrying wafers in a COT layer.

Suppose that the COT layer F3 is changed from a state shown in FIG. 5 to a state shown in FIG. 6 by removing the trouble in the resist solution application module COT4 and the excluded resist solution application module COT4 is restored to a usable state which permits carrying a wafer W to the resist solution application module COT4. Then, wafers W not carried to COT1 to COT4 can be carried to the COT4 in accordance with the foregoing rules. Since wafers W are carried to COT1, COT2 and COT3 in that order, the carrying schedule is changed so as to carry the next wafer W to COT4 after carrying the wafer W to COT3; that is, the carrying schedule is changed such that the wafer A4 is carried into COT4 as indicated by the arrow in FIG. 6 the wafers A5 and A6 are carried, respectively, into COT1 and COT2.

Altered Carrying Schedule 2

Figure 7:
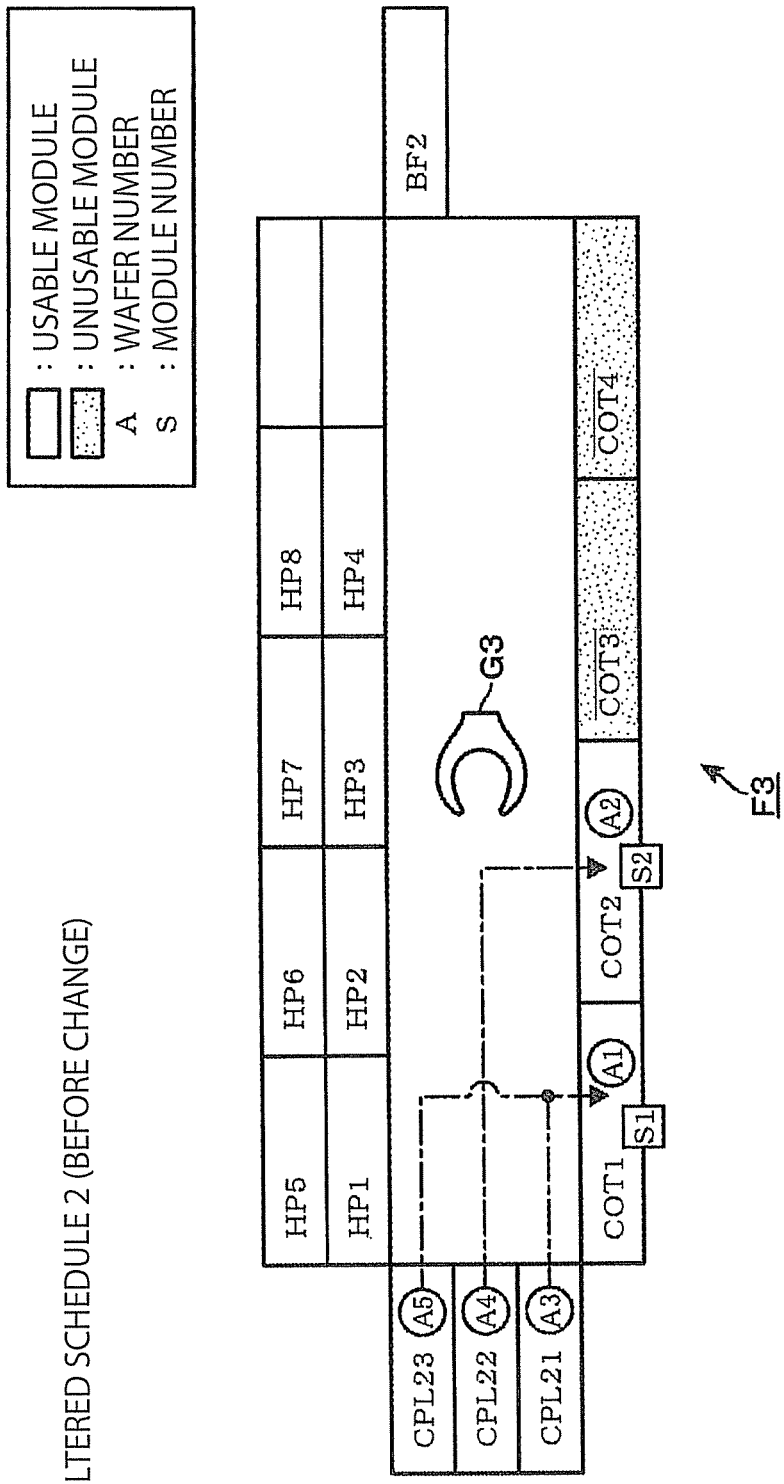
FIG. 7 is a schematic view of assistance in explaining a normal carrying schedule for carrying wafers in a COT layer.

An altered carrying schedule 2 will be described as applied to, similarly to the altered carrying schedule 1, carrying wafers W to the resist solution application modules COT. FIG. 7 shows a state where the resist solution application modules COT3 and COT4 are excluded due to trouble, wafers A1 and A2 are held, respectively, in the resist solution application modules COT1 and COT2 and wafers A3, A4 and A5 have been delivered, respectively, to the transfer modules CPL21, CPL22 and CPL23. Since the resist solution application modules COT3 and COT4 are unusable, a carrying schedule is changed such that the wafers A4, A5 and A6 are carried in numerical carrying order, respectively, to the resist solution application modules COT1, COT2 and COT1 as indicated by the arrows.

Figure 8:
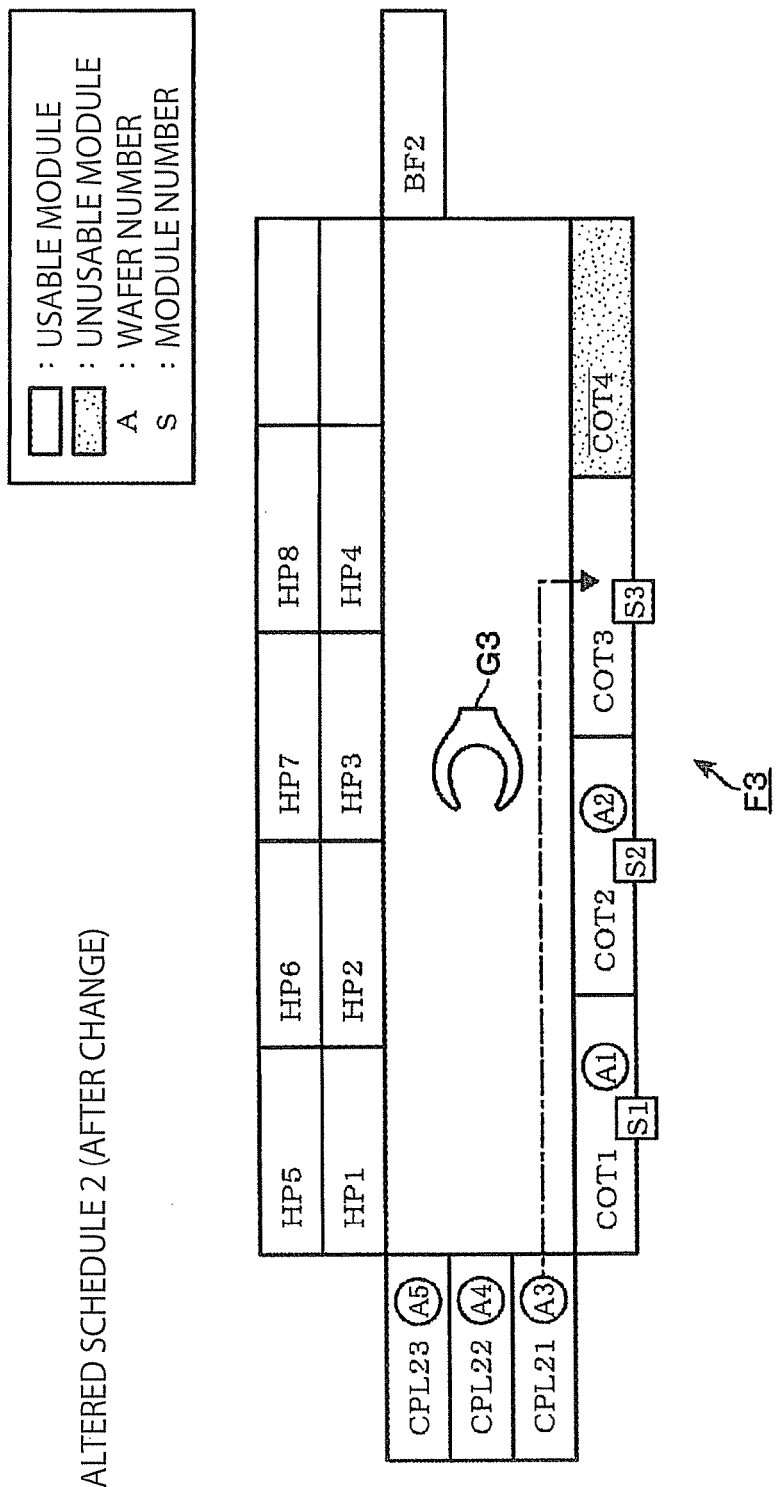
FIG. 8 is a schematic view of assistance in explaining an altered carrying schedule for carrying wafers in a COT layer.

Suppose that the resist solution application module COT3 becomes usable and the state shown in FIG. 7 changes into a state shown in FIG. 8. Then, a wafer W not carried to the resist solution application modules COT1 to COT4 can be carried into the resist solution application module COT3 upon the restoration of the resist solution application module COT3 to a usable state. Since wafers W are carried to COT1 and COT2 in that order, the carrying schedule is altered such that the next wafer W is carried into COT3 according to carrying order; that is, the carrying schedule is altered such that the wafer A3 is carried into COT3 as indicated by the arrow in FIG. 8. The wafers A4 and A5 are carried, respectively, into COT1 and COT2.

Altered Carrying Schedule 3

Figure 9:
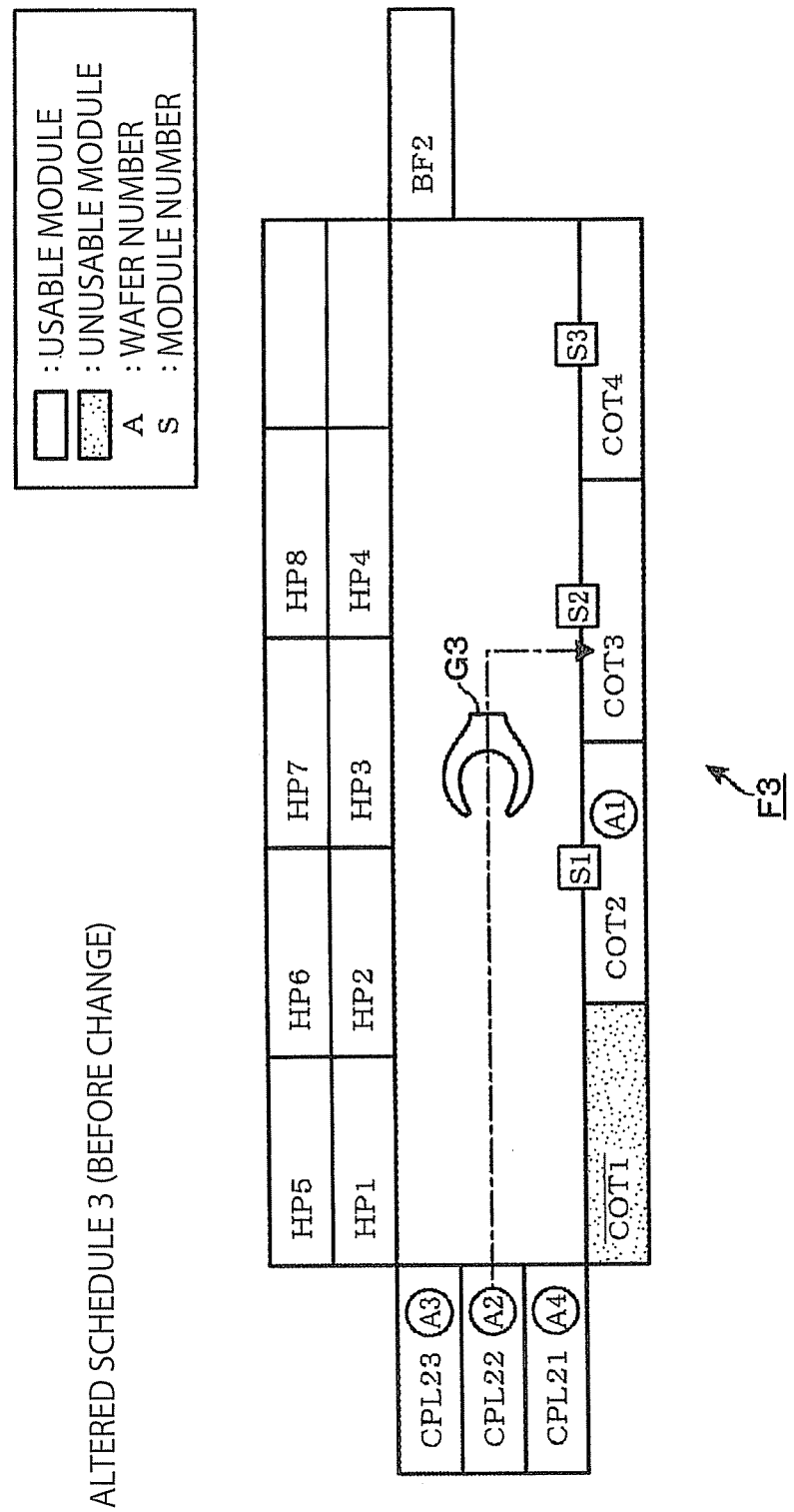
FIG. 9 is a schematic view of assistance in explaining a normal carrying schedule for carrying wafers in a COT layer.

FIG. 9 shows a state where the resist solution application module COT4 is excluded due to trouble, a wafer A1 is held in the resist solution application module COT2 and wafers A4, A2 and A3 have been delivered, respectively, to the transfer modules CPL21, CPL22 and CPL23. Since the resist solution application modules COT1 is unusable, a carrying schedule is altered such that the wafers A2, A3 and A4 are carried sequentially, respectively, to the resist solution application modules COT3, COT4 and COT2.

Figure 10:
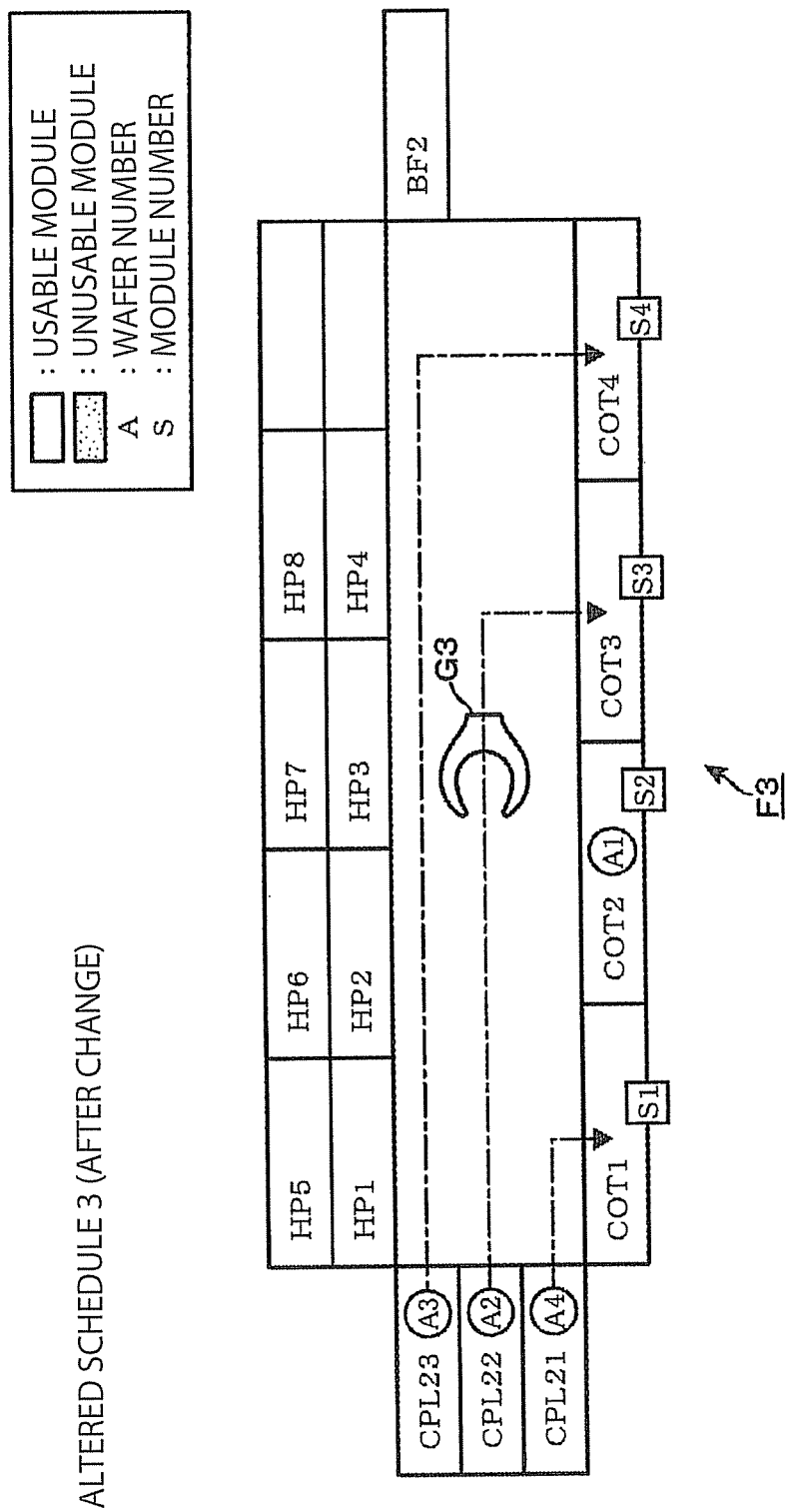
FIG. 10 is a schematic view of assistance in explaining an altered carrying schedule for carrying wafers in a COT layer.

Suppose that the resist solution application module COT1 becomes usable and the state shown in FIG. 9 changes into a state shown in FIG. 10. Then, the carrying schedule is altered in conformity to the rules such that a wafer W not carried to the resist solution application modules COT1 to COT4 can be carried into the resist solution application module COT1 upon the restoration of the resist solution application module COT1 to a usable state. Since the wafers A1 is carried to COT2, the carrying schedule is altered such that the wafers A2 and A3 subsequently carried into the resist solution application layer are carried into COT3 and COT4 in carrying order. Wafers A5, A6, A7, A8, . . . and An succeeding the wafer A1 are carried into COT2, COT3, COT4, COT1, . . . in that order.

Altered Carrying Schedule 4

Figure 11:
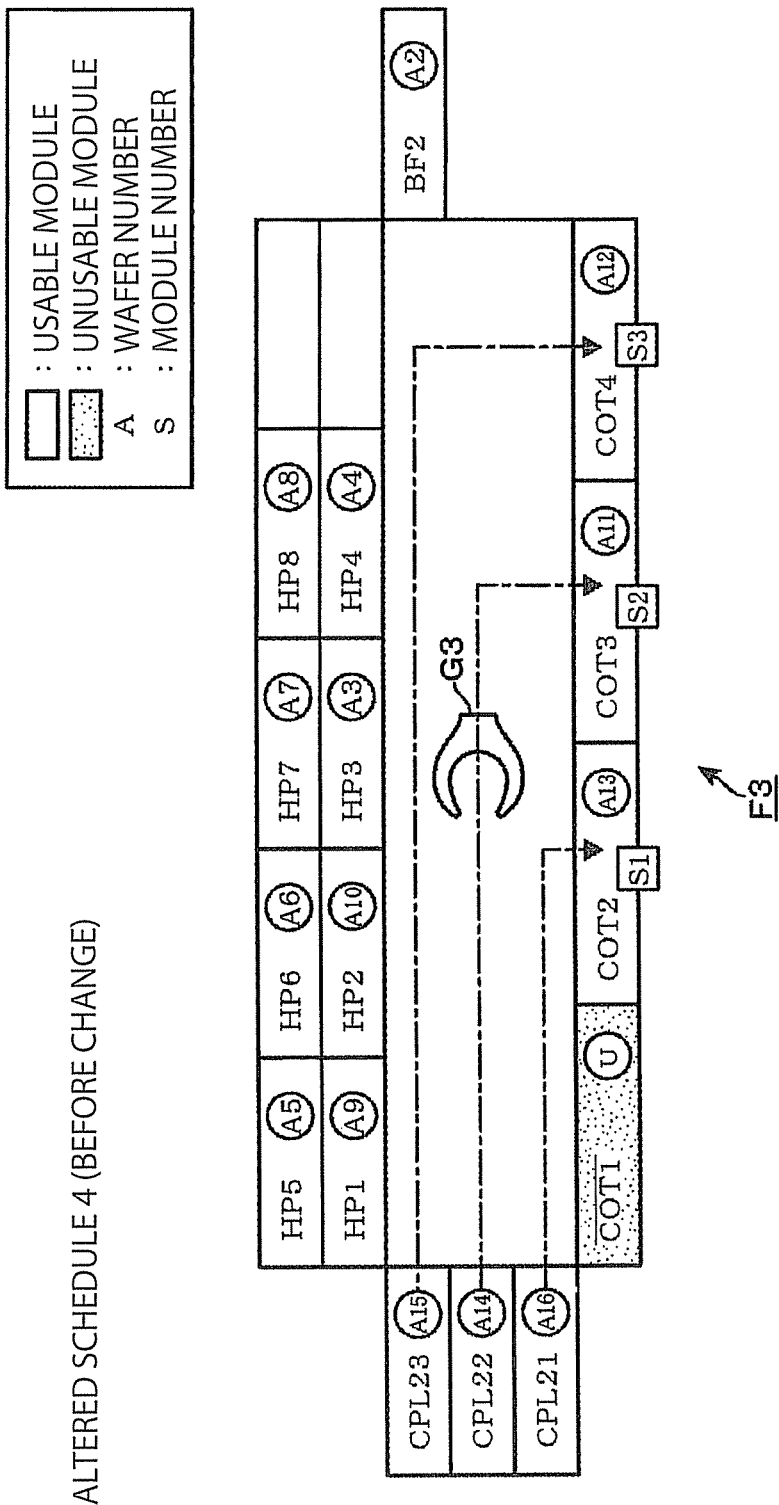
FIG. 11 is a schematic view of assistance in explaining a normal carrying schedule for carrying wafers in a COT layer.

FIG. 11 shows a state where the resist solution application module COT1 is excluded due to trouble, a left wafer U is held in the resist solution application module COT1 and wafers A16, A14 and A14 have been delivered, respectively, to the transfer modules CPL21, CPL22 and CPL23. Since the resist solution application modules COT1 is unusable, a carrying schedule is formed such that the wafers A14, A15 and A16 are carried sequentially, respectively, to the resist solution application modules COT3, COT4 and COT2.

Figure 12:
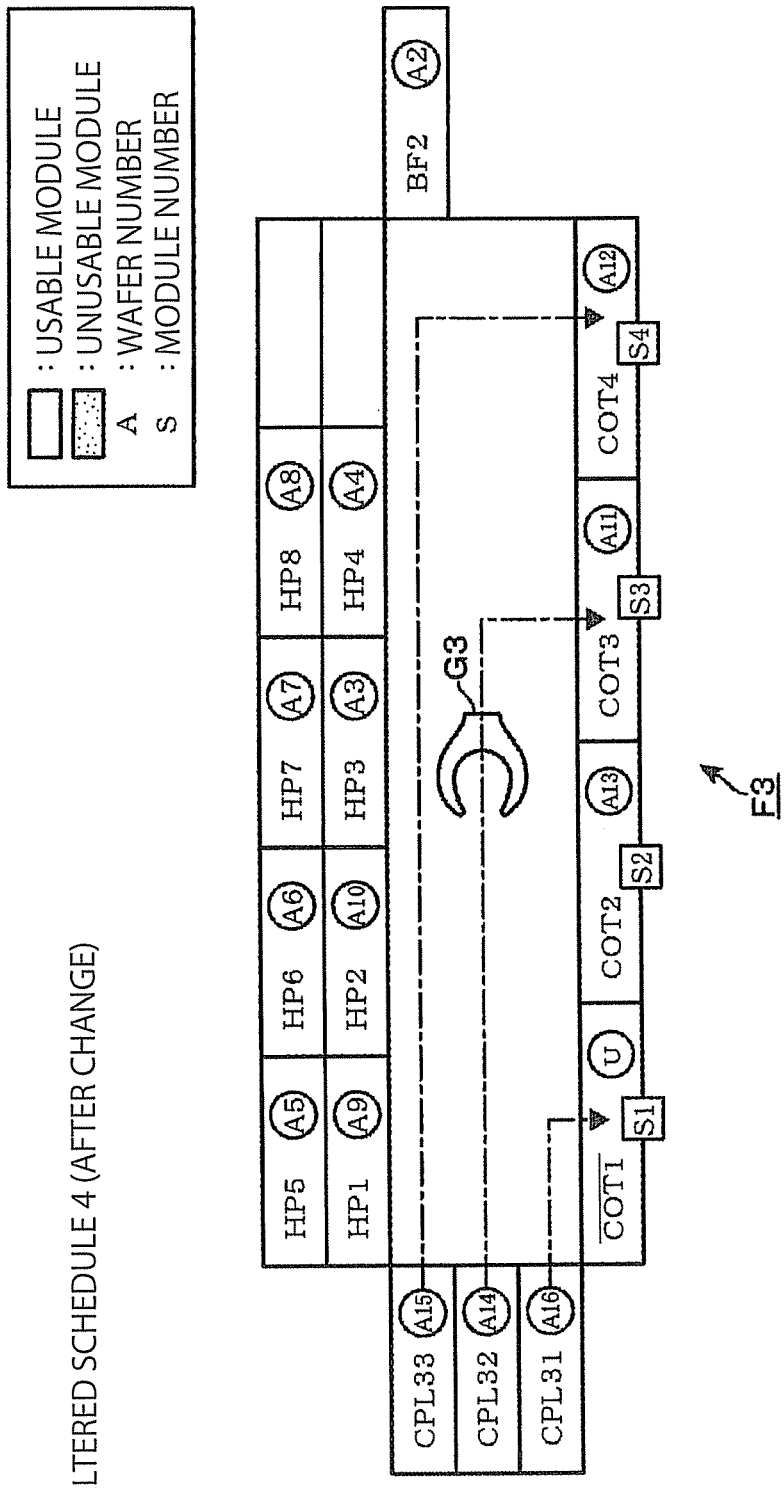
FIG. 12 is a schematic view of assistance in explaining an altered carrying schedule for carrying wafers in a COT layer.

Suppose that the resist solution application module COT1 becomes usable and the state shown in FIG. 11 changes into a state shown in FIG. 12. Since the wafer A13 is carried into COT2, the wafers A14 and A15 subsequently delivered to the COT layer are carried into COT3 and COT4 in carrying order specified for the COT layer. Even if the left wafer U is held in the excluded COT module, a wafer W is carried into the once excluded COT module upon the restoration of the excluded COT module to a usable state. The left wafer U held in the resist solution application module COT1 is transferred to the transfer module BF2. Wafers A17, A18, A19, A20, . . . subsequent to the wafer A16 are carried in that order, respectively, to COT2, COT3, COT4, COT1, . . . .

Altered Carrying Schedule 5

Figure 13:
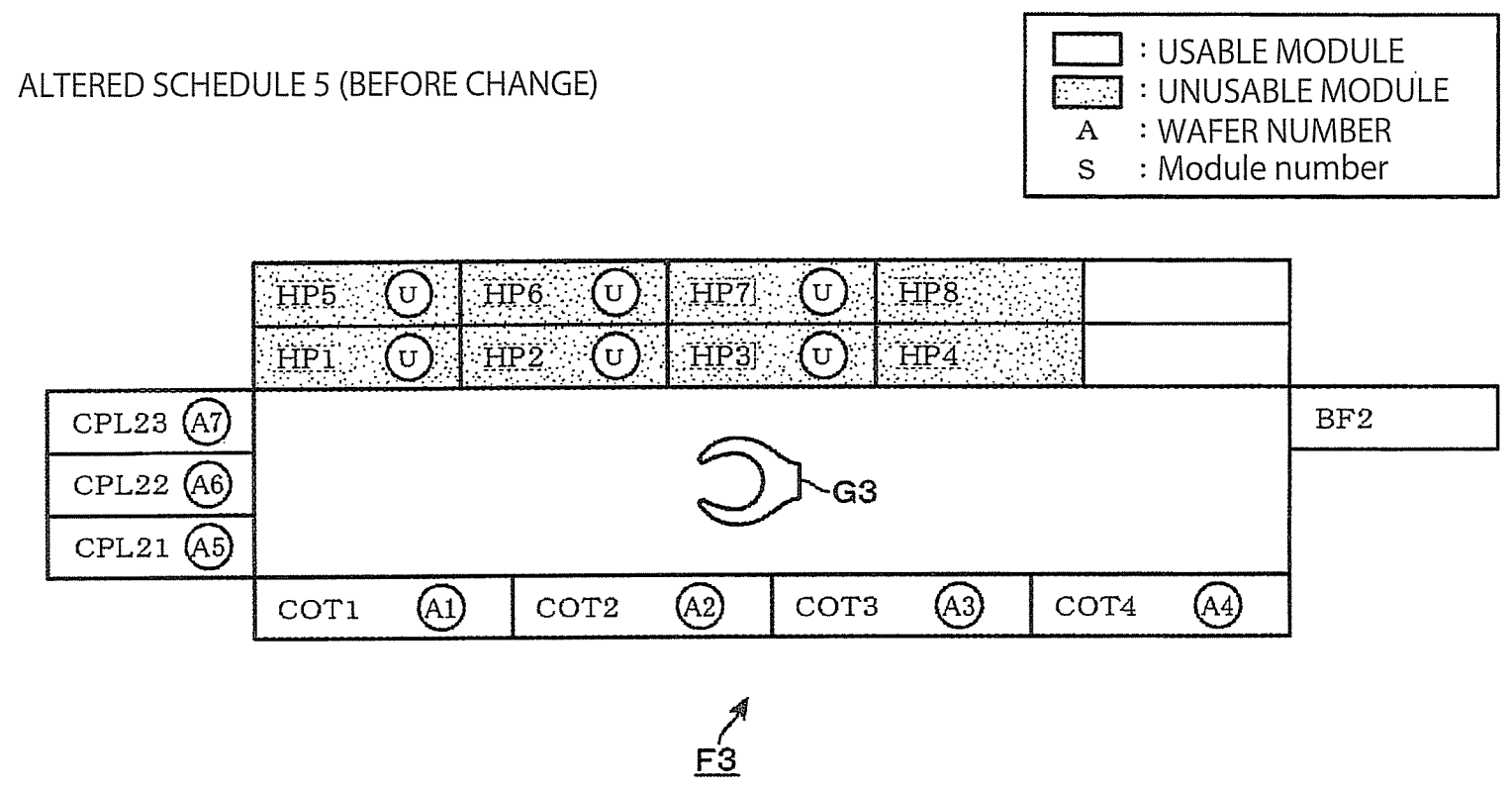
Figure 14:
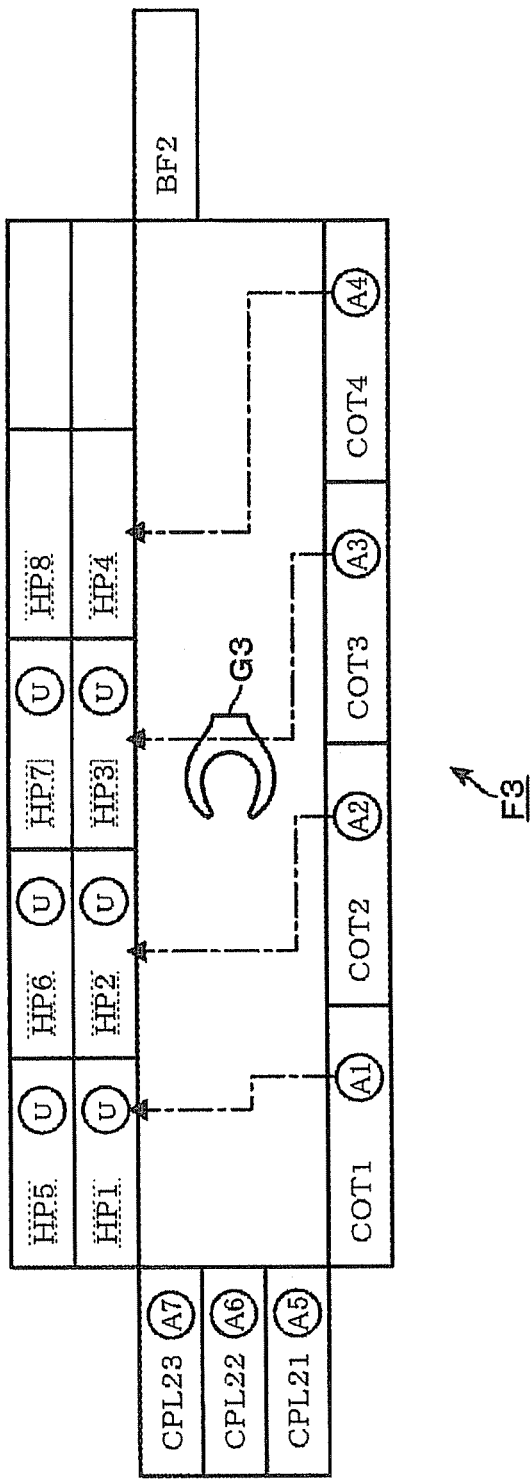
FIG. 14 is a schematic view of assistance in explaining an altered carrying schedule for carrying wafers in a COT layer.

FIG. 13 shows a state where the heating modules HP1 to HP8 are excluded due to trouble, left wafers U are held in the heating modules HP1 to HP3 and HP5 to HP7 and wafers A1 to A4 are held in the resist solution application modules COT1 to COT4. Suppose that trouble in the heating modules HP1 to HP8 is removed, the heating modules HP1 to HP8 become usable and the state shown in FIG. 13 changes into a state shown in FIG. 14. Then, a carrying schedule is formed in conformity to the foregoing rules such that wafers are carried to the heating modules HP in predetermined carrying order whether or not left wafers U are held in the excluded heating modules HP. Consequently, wafers A1, A2, A3 and A4 are carried sequentially, respectively, to the heating modules HP1, HP2, HP3 and HP4 as indicated by the arrows in FIG. 14. The left wafers U are transferred from the heating modules HP1 to HP3 to the transfer module BF2. A carrying route to be taken to carry the left wafers U will be described later.

Altered Carrying Schedule 6

Figure 15:
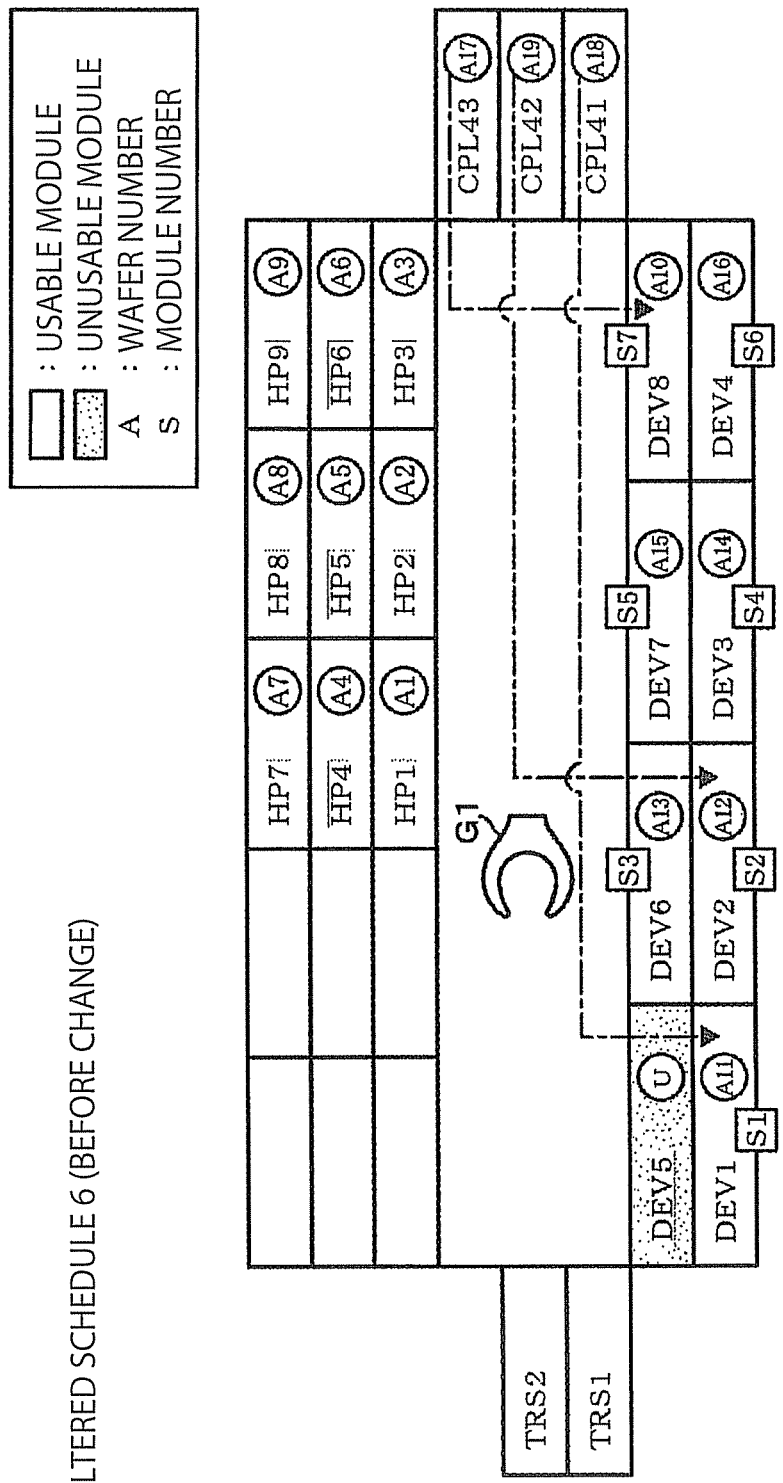
FIG. 15 is a schematic view of assistance in explaining a normal carrying schedule for carrying wafers in a DEV layer.
Figure 16:
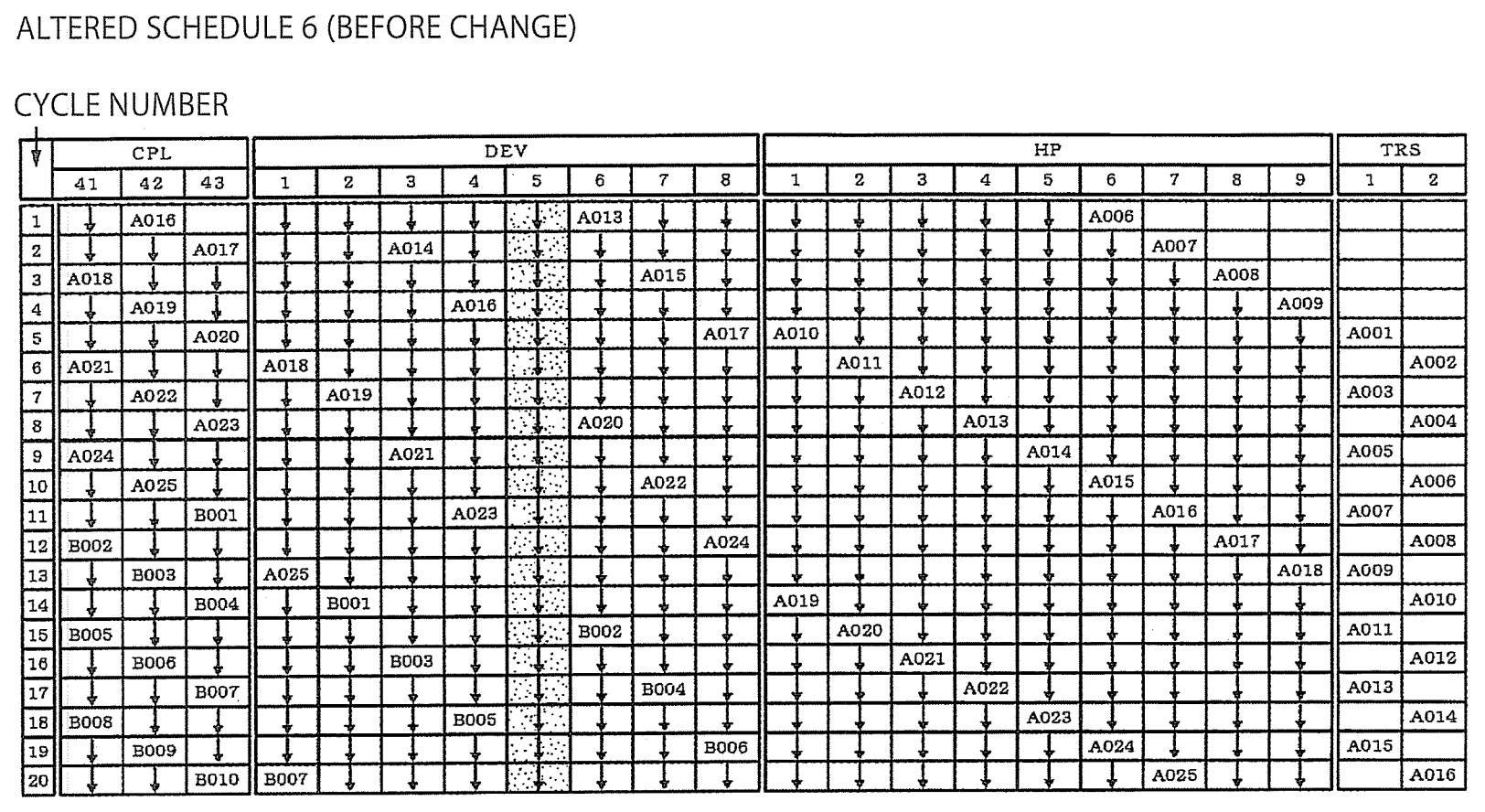

Carrying operations in the DEV layer F1 will be described. In the normal carrying mode, wafers W are carried sequentially in the DEV layer F1 to DEV1, DEV5, DEV2, DEV6, DEV3, DEV7, DEV4, DEV8, DEV1, . . . in that order. In the normal carrying mode for carrying wafers W processed by a developing process and to be subjected to a heating process to the heating modules HP, the wafers W are carried to HP1, HP2, HP3, . . . in carrying order. FIG. 15 is a planar development showing the modules of the DEV layer F1. In a state shown in FIG. 15, the developing module DEV5 is excluded due to trouble, a left wafer U is held in the developing module DEV5. FIG. 16 is a table showing a carrying schedule to be taken for carrying wafers W in the DEV layer F1 in the state shown in FIG. 15. In the DEV layer F1 shown in FIG. 15, any wafer cannot be carried to DEV5. Therefore, wafers W are carried to DEV1 first and then to DEV2 next. Thereafter, wafers W are carried to the developing modules DEV in the upper developing unit 20 and those of the lower developing unit 20 alternately in a carrying mode similar to the normal carrying mode; that is, wafers W are carried sequentially to DEV6, DEV3, DEV7, DEV4 and DEV8 in that order. In this schedule table and the following schedule tables, modules unusable in carrying cycles are shaded with dots. In those schedule tables, three-figure numbers including 0 as a head figure are assigned to wafers. W, respectively.

FIG. 15 shows a state of the developing layer F1 in a carrying cycle 4 shown in FIG. 16 in which wafers A18, A19 and A17 are held, respectively, in transfer modules CPL41, CPL42 and CPL43. According to the carrying schedule, those wafers W are carried into the developing modules DEV8, DEV1 and DEV2, respectively.

Figure 17:
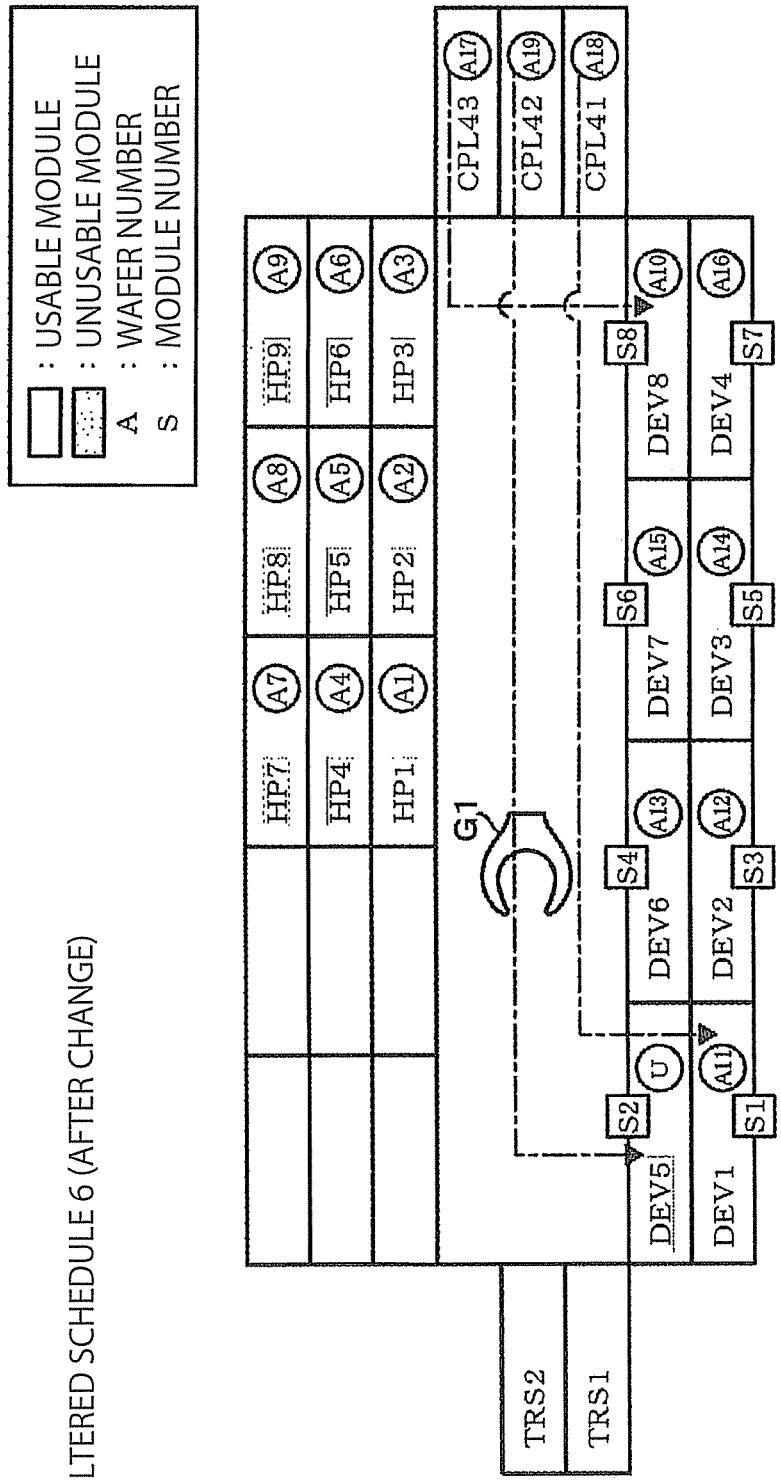
FIG. 17 is a schematic view of assistance in explaining a normal carrying schedule for carrying wafers in a DEV layer.
Figure 18:
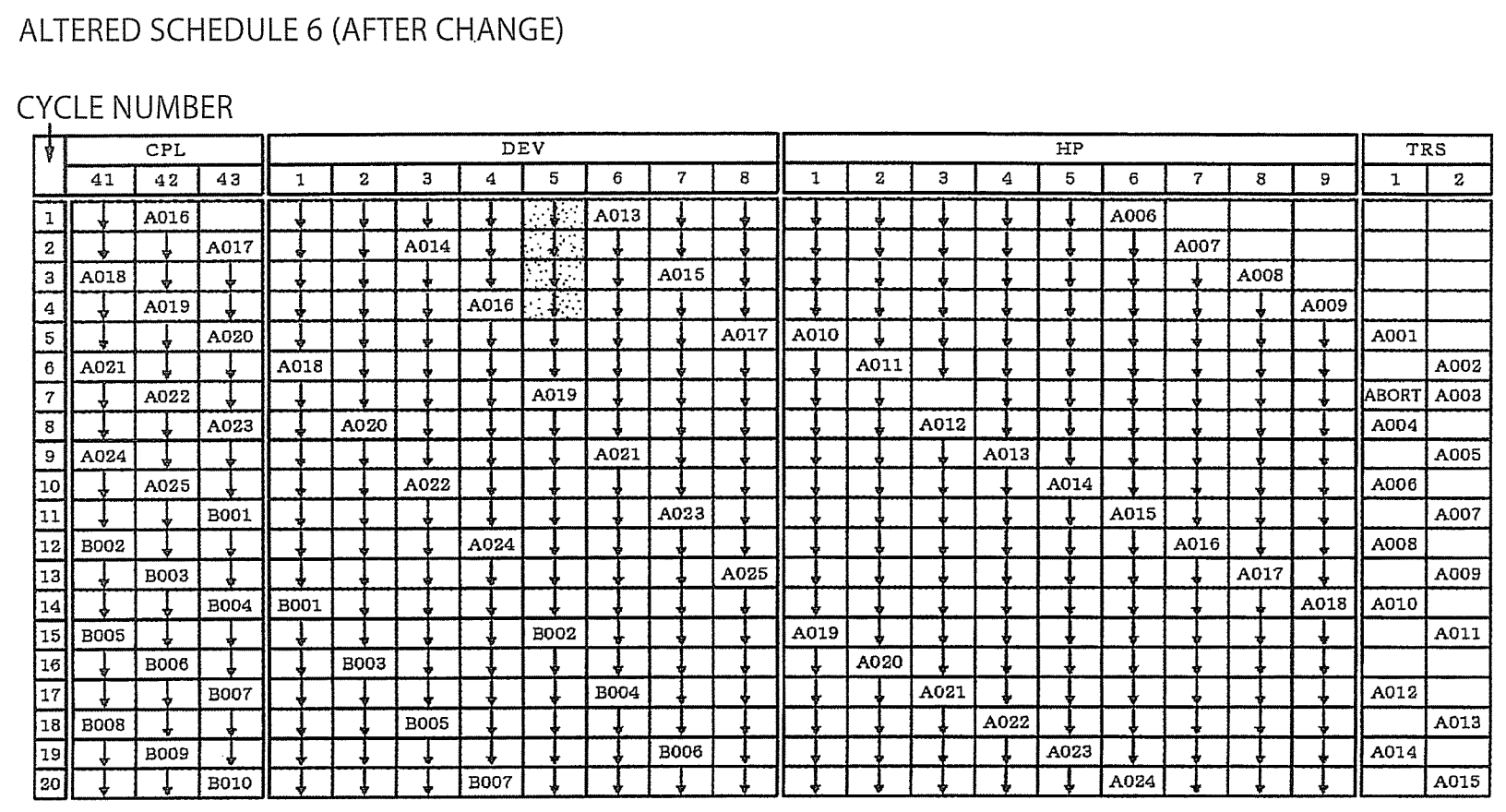

If the trouble in the developing module DEV5 is removed and the developing module DEV5 becomes usable in the carrying cycle 4, the carrying schedule is altered in conformity to the foregoing rules such that a wafer W not carried to the developing modules DEV1 to DEV8 can be carried to the developing module DEV5 restored to a usable state. A wafer A16 is carried into DEV4 in the carrying cycle 4. To carry wafers W to the DEV modules in predetermined carrying order, the wafer A17 is carried into DEV8 as shown in FIG. 17. The next wafer A18 is carried according to the predetermined carrying order into DEV1, the wafer A19 is carried into DEV5 restored to the usable state according to the predetermined carrying order. A left wafer U held in DEV5 is carried out when the wafer A19 is carried into DEV5. Thereafter, wafers are carried in carrying order into the developing modules DEV. An altered carrying schedule for such a carrying mode is shown in FIG. 18.

The altered carrying schedule shown in FIG. 18 will be described in comparison with the carrying schedule shown in FIG. 16. The number of cycles in which each wafer W stays in each DEV module is increased by one due to the change of the destination of the wafer A19 and increase in the number of the usable developing modules DEV. In a carrying cycle 7, the left wafer U is carried to TRS1 and the wafer A3 is transferred from the heating module HP3 to the transfer module TRS2. "ABORT" in FIG. 18 indicates a left wafer U. Since the left wafer U is carried to the transfer module TRS, any wafer W is not carried into the heating module HP in a carrying cycle subsequent to the carrying cycle in which the left wafer U is transferred to the transfer module TRS. Since two wafers are carried to the transfer module TRS in the carrying cycle 7, any wafer W is not carried into the transfer module TRS in a carrying cycle 16.

Altered Carrying Schedule 7

Suppose that each developing unit 20 in this example is provided with three developing modules DEV. The lower developing module 20 is provided with developing modules DEV1 to DEV3, and the upper developing unit 20 is provided with developing modules DEV4 to DEV6. The developing units 20 are similar in constitution to those of other embodiments, except that the number of the developing modules is different from those of the developing units of other embodiments. For example, in the lower developing unit 20, the developing modules DEV1 and DEV2 use the developer pouring nozzle 21A, and the developing module DEV3 uses the developer pouring nozzle 21B. For example, in the upper developing unit 20, the developing modules DEV4 and DEV5 use the developer pouring nozzle 21C, and the developing module DEV6 uses the developer pouring nozzle 21D. When wafers W are not carried in the special carrying mode, wafers W are carried, repeatedly, to DEV1, DEV4, DEV3, DEV2, DEV5 and DEV6 in that order. In this example, the DEV layer F1 is provided with six heating modules HP1 to HP6.

Figure 19:
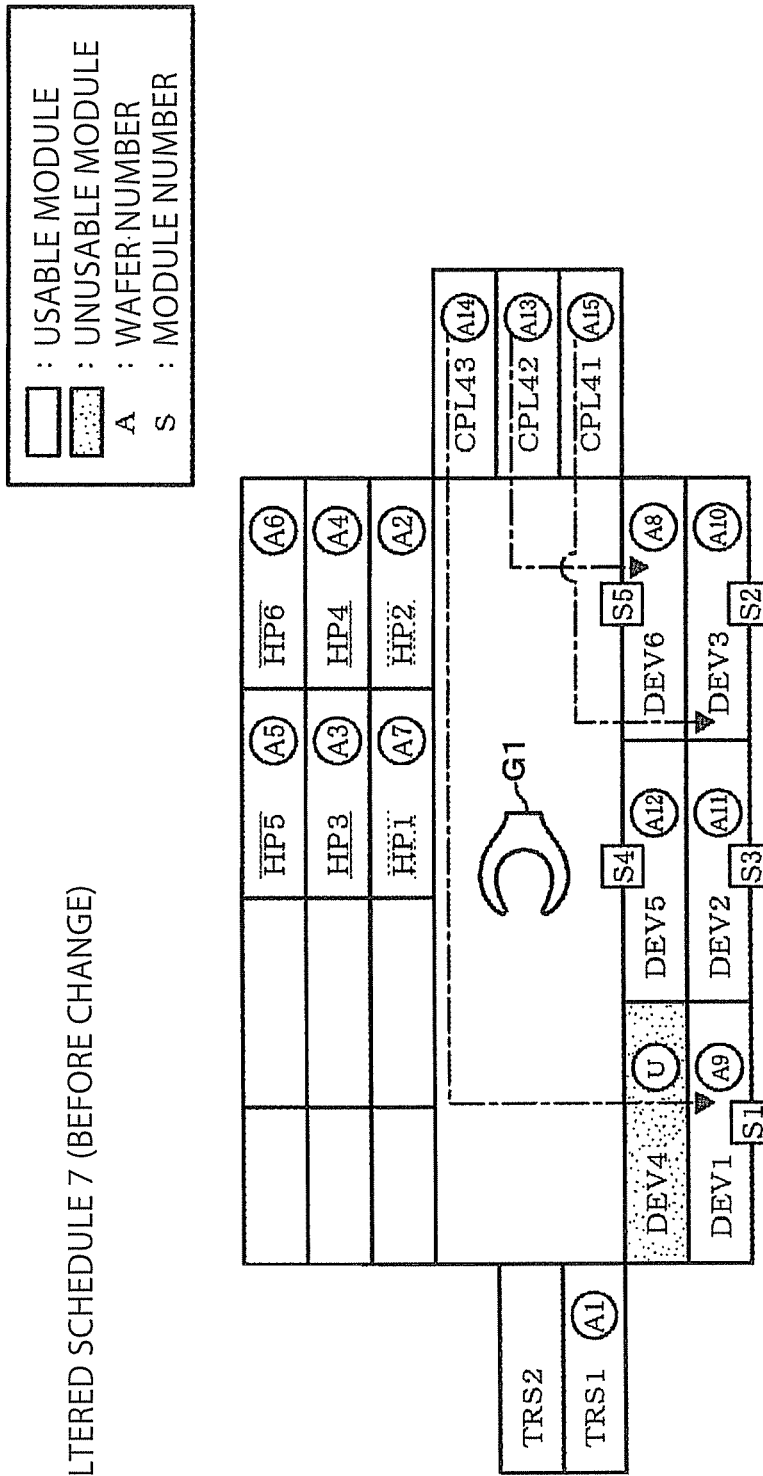
FIG. 19 is a schematic view of assistance in explaining a normal carrying schedule for carrying wafers in a DEV layer.

In an example shown in FIG. 19, the developing module DEV4 is an excluded module and a left wafer U is held in the developing module DEV4. FIG. 20 shows a carrying schedule for carrying wafers W in a state shown in FIG. 19. Since any wafer cannot be carried to DEV4, a wafer W is carried to DEV3 after carrying a wafer W to DEV1. Thereafter, wafers W are carried repeatedly to DEV2, DEV5 and DEV6 in that order in the normal carrying mode.

FIG. 19 shows a state in a carrying cycle 4 shown in FIG. 20. Wafers A15, A13 and A14 are carried into the transfer modules CPL41, CPL42 and CPL43, respectively. The carrying schedule is formed such that those wafers are carried into the developing modules DEV6, DEV1 and DEV3, respectively.

Suppose that the trouble is removed from the developing module DEV4 and the developing module DEV4 is restored to a usable state in the carrying cycle 4 as shown in FIG. 21. A wafer A12 is carried into DEV5 in the carrying cycle 4. Since wafers are carried into the developing modules DEV in predetermined carrying order, a succeeding wafer A13 is carried into DEV6 according to the carrying order. A subsequent wafer A14 is carried into DEV1 in its turn. Subsequently, a wafer A15 is carried into DEV4 restored to a usable state in its turn and the left wafer U held in DEV4 is carried out from DEV4. Thereafter wafers are carried in the carrying order to developing modules DEV. The carrying schedule is altered such that wafers are carried in such a carrying mode. FIG. 22 shows an altered carrying schedule. As compared with the carrying schedule shown in FIG. 20, according to the altered carrying schedule shown in FIG. 22, the number of cycles for which a wafer W is kept in each developing module DEV and such is changed.

Figure 23:
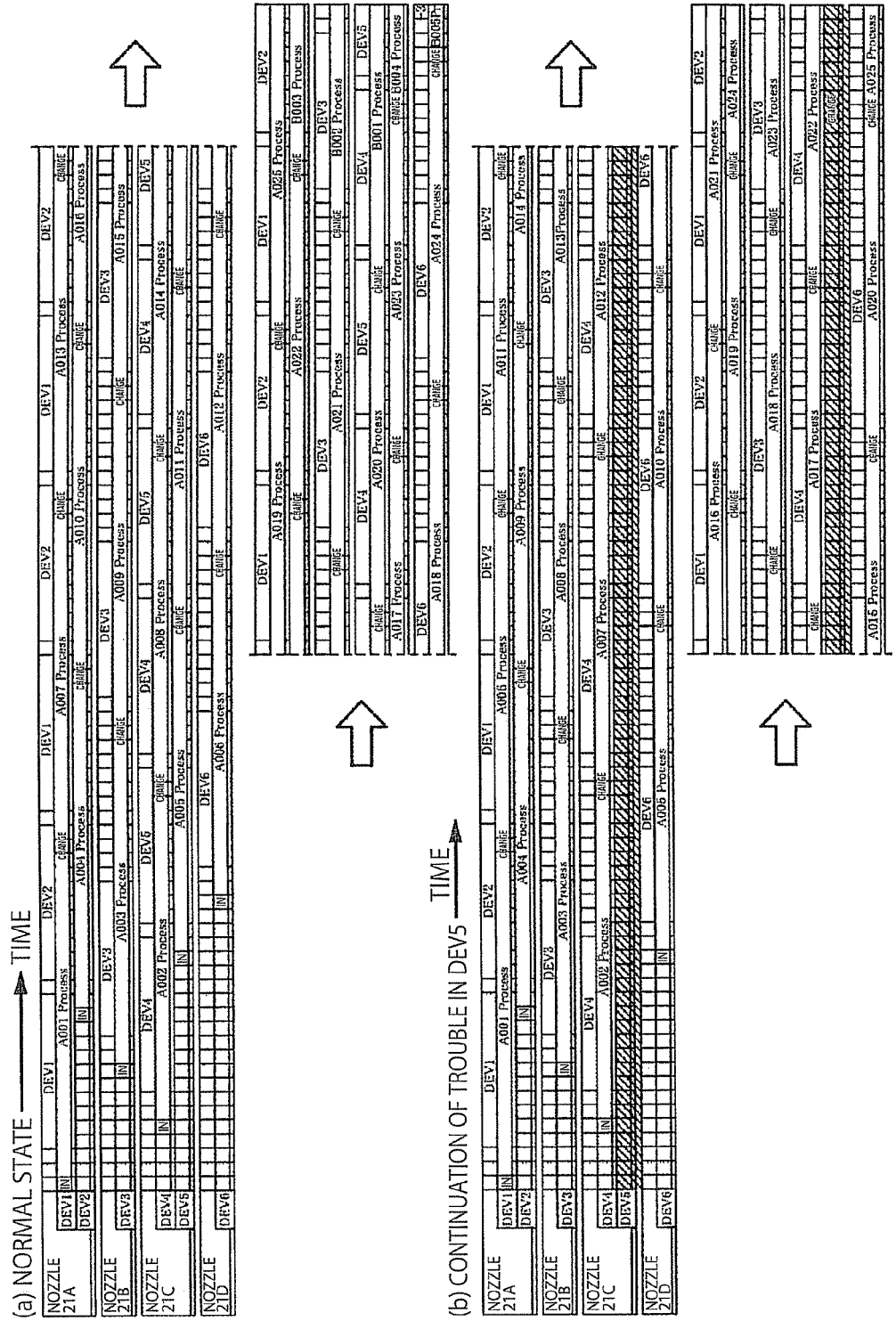
FIG. 23 is a time chart of assistance in carrying a wafer to and from a developing module.
Figure 24:
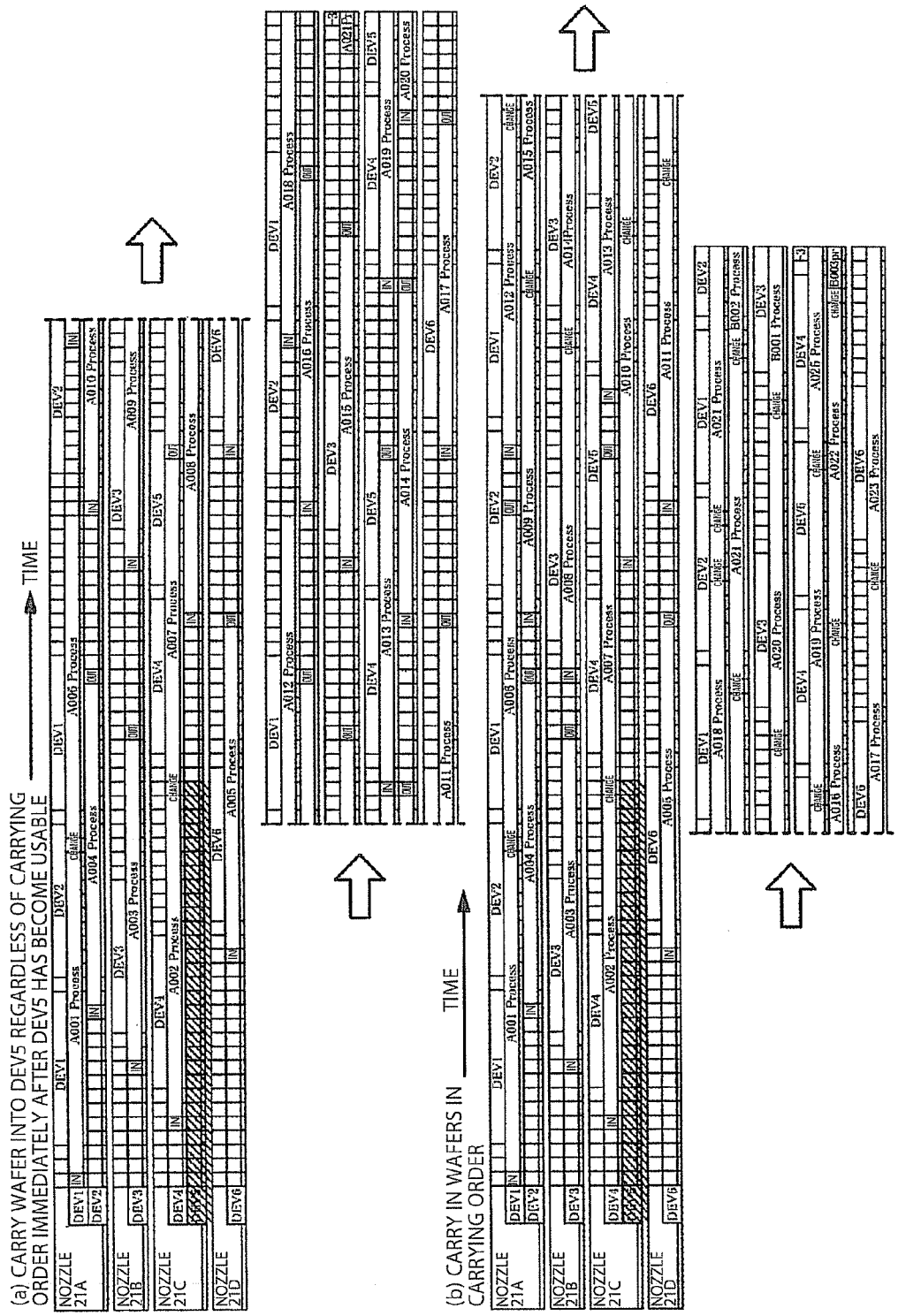
FIG. 24 is a time chart of assistance in explaining carrying wafers to and carrying out wafers from a developing module.

Another carrying schedule for carrying wafers in the DEV layer F1, similar to the altered carrying schedule 7, will be described with reference to FIGS. 23 and 24. FIGS. 23 and 24 are time charts of assistance in explaining wafer processing operations of the developing modules DEV. FIG. 23(a) shows processing operations when there is no trouble in the developing modules DEV1 to DEV6. FIG. 23(b) shows processing operations when trouble arose in DEV6 before the wafer A1 is carried into DEV5. As shown in FIG. 23(a), wafers are carried to the developing modules DEV1, DEV4, DEV3, DEV2, DEV5 and DEV6 in that order.

FIG. 24(a) illustrates a processing state in which DEV5 is restored to a usable state when the wafer A7 is changed, and a wafer W is carried into DEV5 in conformity to the foregoing rules. FIG. 24(b) illustrates a processing state in which DEV5 is restored to a usable state when the wafer A7 is changed, and a wafer W is carried immediately into DEV5 not in conformity to the foregoing rules. In this example, the wafer W is carried into the developing module DEV when the nozzle to be used for processing the wafer W becomes usable. Words "IN", "CHANGE" and "OUT" indicated in the tables denote "carrying wafer in", "changing wafer" and "carrying wafer out", respectively. A section between IN and CHANGE or OUT marked with the number of a wafer W is a processing section in which the module processes the wafer W. In sections marked with module numbers in the top line of a row for each developing nozzle 21 in those tables, the developing nozzle 21 is used by the modules identified by those module numbers. In hatched sections, the developing module DEV5 is unusable. It is known from the comparative observation of a wafer processing mode illustrated in FIG. 24(a) and a wafer processing mode illustrated in FIG. 24(b) that a wafer carrying operation for carrying wafers into the developing module is suspended because the developing nozzle 21 is occupied and, consequently, the throughput attained by the wafer processing mode illustrated in FIG. 24(a) is lower than that attained by the wafer processing mode illustrated in FIG. 24(b). Thus, it would be better to carry wafers W sequentially to the modules in conformity to the foregoing rules rather than carrying a wafer W to the module immediately after the module has become usable to attain higher throughput.

In the coating and developing system 1, when an unusable one of the component modules of the multimodule unit, i.e., the group of the developing modules DEV, the heating modules HP or the resist solution application modules COT, is restored to a usable state, wafers carried out from the module preceding the multimodule unit are carried into the component modules of the multimodule unit in carrying order. Thus, the extensive alteration of the original carrying schedule is avoided and increase in intervals at which wafers are carried to the modules can be restrained. Consequently, the reduction of throughput in processing the wafer lot can be prevented. Carrying wafers to all the usable modules restrains the reduction of throughput. Since a left wafer U is recovered from the module when a wafer W is carried into the same module, time necessary for a wafer recovering operation can be reduced.

Description will be given about operations for carrying a wafer W to a module from which a wafer could not be recovered due to trouble arose at the start of the coating and developing system 1. For example, the resist solution application modules COT, the developing modules DEV and edge exposure modules for edge exposure are provided with a sensor for detecting a wafer. When any wafer is not held in the module provided with the sensor in a state where a wafer can be carried into and carried out from the same module in the special carrying mode, a wafer is carried to the same module. If a wafer is held in the module, the module is used after completing a wafer recovering operation. The edge exposure modules are installed, for example, in the shelf units U1 to U5 of the COT layer F3. The edge exposure modules process a wafer coated with a resist film by an edge exposure process.

For example, the heating modules HP are not provided with the sensor. Even if the module not provided with the sensor becomes able to receive a wafer W during a carrying operation in the special carrying mode, a wafer W is carried to that module after all the wafers have been recovered. Thus, the module not provided with the sensor becomes able to receive a wafer after all the wafers have been recovered whether or not a wafer is held in that module.

An all-wafer recovering operation for recovering all the wafers returns the wafers W held in the modules of the coating and developing system 1 to the carrier C by the carrying means. The all-wafer recovering operation is started in response to an instruction provided by the operator. When a wafer W can be carried out from the excluded module, the wafer W is recovered by the all-wafer recovering operation. The all-wafer recovering operation, similar to a left wafer carrying operation, which will be described later, carries wafers down the carrying route bypassing the modules expected to process those wafers and returns the wafers to the carrier C. When the all wafer recovering operation is completed, an alarm that wafers are unable to be carried out from the module stops. If a wafer cannot be carried to the excluded module after all the wafers have been recovered, an alarm that a wafer cannot be carried to the excluded module is given.

Figure 25:
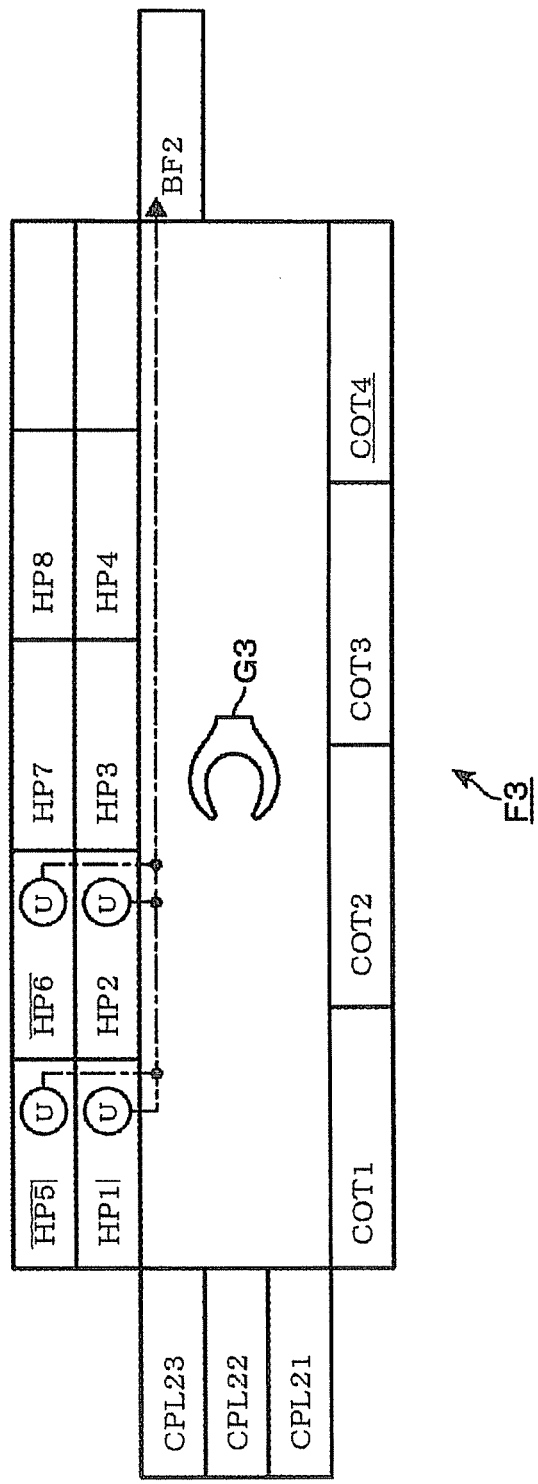
FIG. 25 is a schematic view of assistance in explaining a carrying schedule for carrying wafers in a COT layer.
Figure 26:
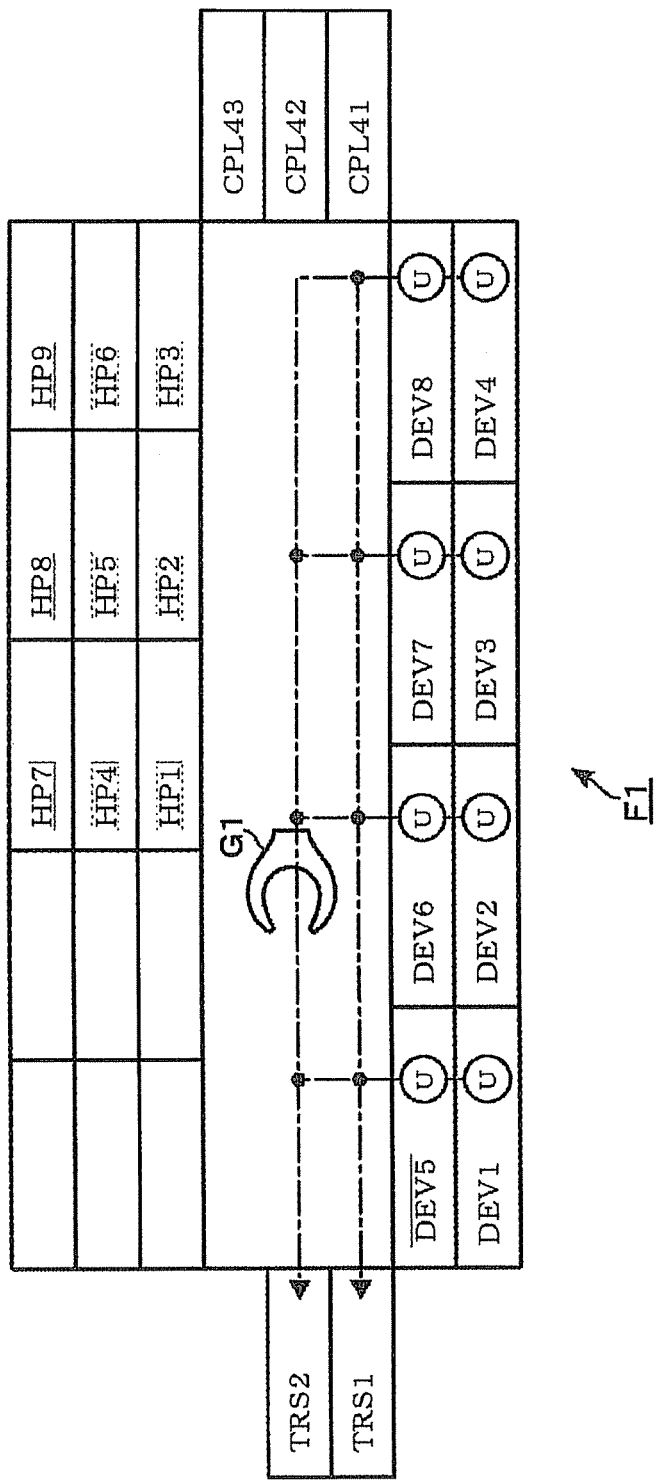
FIG. 26 is a schematic view of assistance in explaining a carrying schedule for carrying wafers in a DEV layer.

A left wafer carrying operation for carrying left wafers U will be described. Left wafers U are carried to the transfer module at the exit, namely, on the downstream side of the carrying route, to avoid the left wafers U overtaking normal wafers W in the layer in which the left wafers U are carried. More concretely, as shown in FIG. 25, left wafers U are carried in the COT layer F3 to the transfer module BF2. Then, the left wafers U are moved on the downstream side of the transfer module BF2, for example, the left wafers U are moved sequentially through the ITC layer F4, the shuttle carrier 16, the transfer module TRS11 or TRS12 and the DEV layer F1 and are returned to the carrier C. In FIG. 26, left wafers U held in the developing modules DEV1 to DEV8 are carried to the transfer modules TRS1 and TRS2.

As mentioned above, the left wafers U are not carried into the exposure system C5. In the processing block C2, the left wafers U are returned to the carrier C without passing the wafer processing modules, such as the heating module, the protective film forming module and the developing modules. Therefore, left wafers U are returned to the carrier C earlier than wafers W to be processed by the regular processes.

The controller 100 gives instructions included in wafer processing recipes for processing wafers W to the modules to process wafers W according to the recipes. Since the left wafer U is carried in the foregoing mode, any instructions for processing the left wafer U are not given to the modules even if instructions given to the modules are different from the instructions for processing the left wafer U.

Operations for processing a lot of wafers W including a left wafer U are not accomplished until the left wafer U is returned to the carrier C. Therefore, the carrier C from which the left wafer U was carried out is held, for example, in the carrier block C1 until the left wafer U is returned thereto.

Figure 27:
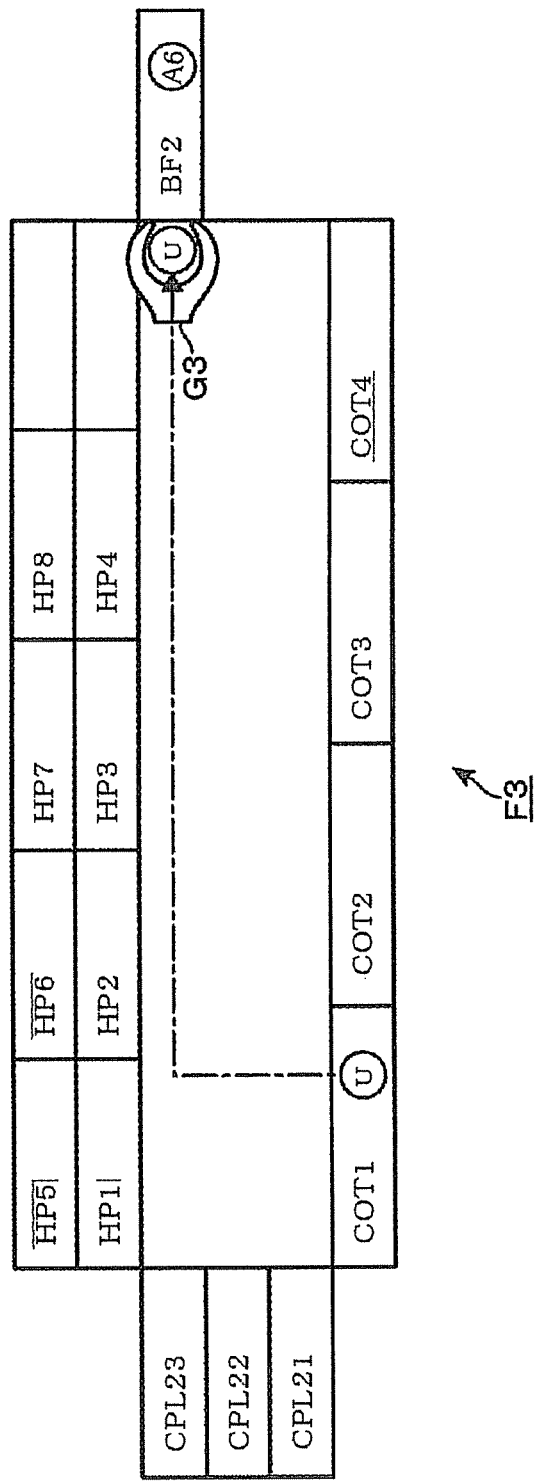
FIG. 27 is a schematic view of assistance in explaining a carrying schedule for carrying wafers in a COT layer.
Figure 28:
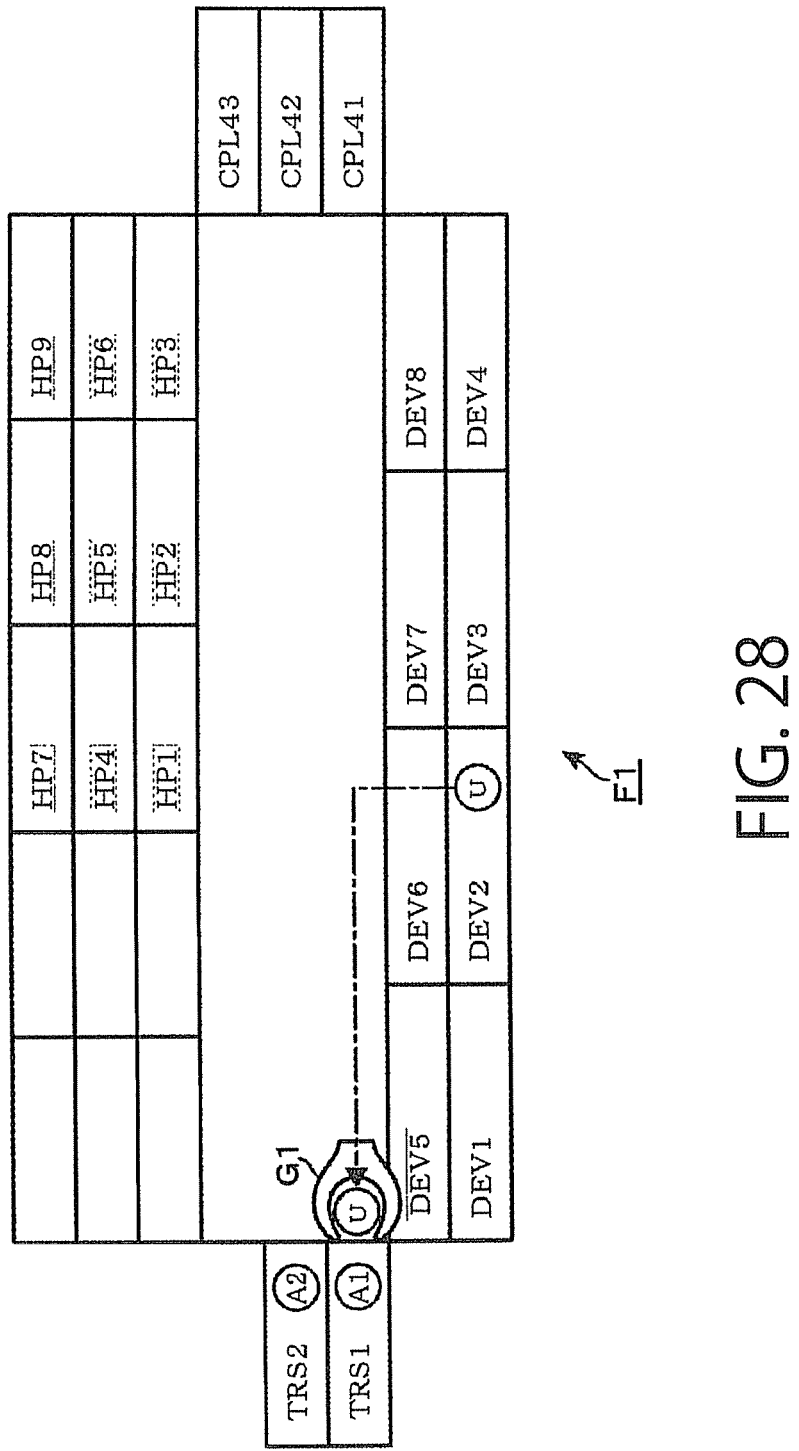
FIG. 28 is a schematic view of assistance in explaining a carrying schedule for carrying wafers in a DEV layer.

When the left wafer U cannot be carried to the transfer module, the carrying arm G holds the left wafer U and waits on until the left wafer U can be carried to the transfer module. FIGS. 27 and 28 illustrate a state in which the carrying arm G is waiting on for a state in which the left wafer U can be transferred to the transfer module. In FIG. 27, the transfer module BF2 of the COT layer F3 is occupied by a wafer A6 and the carrying arm G2 holding a left wafer U received from the resist solution application module COT1 is waiting on.

In FIG. 28, the transfer modules TRS1 and TRS2 of the DEV layer F1 are occupied by wafers A1 and A2, respectively, and the carrying arm G1 holding a left wafer U received from the developing module DEV2 waits on until the transfer module TRS1 or TRS2 becomes vacant.

In this example, the left wafer U is recovered through the module to which a regular wafer W is carried. The coating and developing system 1 may be provided with a recovery module to which a left wafer U is carried exclusively to recover the left wafer U. For example, in the COT layer F3, a transfer module BF5 may be placed on top of the transfer module BF2, and a regular wafer W and a left wafer U may be carried into the transfer modules BF2 and BF5, respectively. The left wafer U carried into the transfer module BF5 is carried, similarly to a regular wafer W, to the ITC layer F4 by the transfer arm D2 and is carried thereafter along the foregoing route.

What is claimed is:

1. A substrate processing system comprising:
    modules each capable of holding a substrate and identified by module numbers indicating numerical carrying order of carrying and including a multimodule unit including three or more unit modules identified by the same module number and built to execute the same process;
    carrying means for taking out a substrate from a preceding module and transferring the same substrate to a succeeding module after receiving a substrate from the succeeding module in one carrying cycle, and executing one carrying cycle after another to carry substrates sequentially from lower modules identified by lower module numbers to higher modules identified by higher module numbers and to subject substrates to predetermined processes;
    in a normal state, substrates being carried in predetermined carrying order to the unit modules of the multimodule unit from the module preceding the multimodule unit, distribution numbers indicating distribution order in which substrates are distributed to the unit modules of the multimodule unit being assigned to the unit modules of the multimodule unit, and a substrate being delivered to a first unit module identified by a lowest distribution number of the multimodule unit after a substrate has been delivered to a last unit module identified by a highest distribution number of the multimodule unit;

a storage device storing a carrying schedule formed by arranging carrying cycle data specifying carrying cycles by matching numbers assigned to substrates and modules in a time series; and a controller for controlling the carrying means to make the carrying means execute the carrying cycles such that substrates written to the carrying cycle data are carried to corresponding modules, respectively;

wherein upon a change of state where at least one of the unit modules of the multimodule unit is unusable and the rest of the unit modules are usable into a state where all the unit modules of the multimodule unit are usable, the controller controls the carrying means such that the carrying means carries a substrate taken out from a module preceding the multimodule unit to a target unit module of the multimodule unit next to a proceeding unit module of the multimodule unit in carrying order, the proceeding unit being defined as one unit module of the multimodule unit to which a substrate is taken out in time nearest to time when a substrate is taken out from the module preceding the multimodule unit.

2. The substrate processing system according to claim 1, wherein a second carrying means takes out a substrate from a module at a downstream end among the modules, and the controller controls, when a substrate carried out from the module preceding the multimodule unit is to be carried into the unusable module and a substrate is held in the unusable module, the second carrying means to carry a substrate by the second carrying means to the module to which a substrate can be transferred.

3. The substrate processing system according to claim 2, wherein the substrate held in the unusable module is carried to the module at the downstream end.

4. The substrate processing system according to claim 2, wherein the modules capable of holding a substrate and identified by module numbers indicating numerical carrying order in which substrates are carried to the modules are included in a coating and developing system for coating a substrate with a resist and developing a latent image formed on a substrate by an exposure process and for forming films on a substrate before a substrate is subjected to the exposure process.

5. The substrate processing system according to claim 2, wherein the modules capable of holding a substrate and identified by module numbers indicating numerical carrying order in which substrates are carried to the modules are included in a coating and developing system for coating a substrate with a resist and developing a latent image formed on a substrate by an exposure process and for processing substrates by processes including a developing process after the exposure process.

6. The substrate processing system according to claim 2, wherein the modules capable of holding a substrate and identified by module numbers indicating numerical carrying order in which substrates are carried to the modules are included in a coating and developing system for coating a substrate with a resist and developing a latent image formed on a substrate by an exposure process and for forming a film on a substrate before the exposure process.

7. The substrate processing system according to claim 6, wherein the modules capable of holding a substrate and identified by module numbers indicating numerical carrying order in which substrates are carried to the modules are included in a coating and developing system for coating a substrate with a resist and developing a latent image formed on a substrate by an exposure process and for processing a substrate by processes including a developing process after the exposure process.

8. The substrate processing system according to claim 6, wherein a first carrying mechanism for carrying a substrate to the modules for forming a film on a substrate before the exposure process moves along a first horizontal, straight carrying passage, a second carrying mechanism for carrying a substrate to the modules for processing a substrate processed by an exposure process by processes including a developing process moves along a second horizontal, straight carrying passage.

9. The substrate processing system according to claim 1, wherein the modules capable of holding a substrate and identified by module numbers indicating numerical carrying order in which substrates are carried to the modules are included in a coating and developing system for coating a substrate with a resist and developing a latent image formed on a substrate by an exposure process and for processing a substrate by processes including a developing process after the exposure process.

10. The substrate processing system according to claim 1, wherein a first carrying mechanism for carrying a substrate to the modules for forming a film on a substrate before the exposure process moves along a first horizontal, straight carrying passage, a second carrying mechanism for carrying a substrate to the modules for processing a substrate processed by an exposure process by processes including a developing process moves along a second horizontal, straight carrying passage.

11. A substrate processing method to be carried out by a substrate processing system including: modules each capable of holding a substrate and identified by module numbers indicating numerical carrying order of carrying in which substrates are carried to the modules and including a multimodule unit including three or more unit modules identified by the same module number and built to execute the same process, a carrying means which takes out a substrate from a preceding module and transfers a substrate to a succeeding module after receiving a substrate from the succeeding module in one carrying cycle and repeats carrying cycles sequentially to carry substrates sequentially from lower modules identified by lower module numbers to higher modules identified by higher module numbers to subject substrates to predetermined processes;

in a normal state, substrates being delivered in predetermined carrying order to the unit modules of the multimodule unit, distribution numbers indicating distribution order being assigned to the unit modules of the multimodule unit, a substrate being delivered to a first unit module of the multimodule unit after a substrate has been delivered to a last unit module of the multimodule unit; said substrate processing method comprising the steps of:

executing the carrying cycle with reference to a carrying schedule including module numbers assigned to substrates and carrying cycle data arranged in a time series and specifying the module numbers of substrates and corresponding modules by controlling the carrying means to make the carrying means execute carrying cycles such that substrates written to the carrying cycle data are carried to the corresponding modules;

upon a change of state where at least one of the unit modules of the multimodule unit is unusable and the rest of the unit modules are usable into a state where all the unit modules of the multimodule unit are usable, controlling the carrying means by a controller such that the carrying means carries a substrate taken out from a module preceding the multimodule unit to a target unit module of the multimodule unit next to a proceeding unit module of the multimodule unit in carrying order from the proceeding unit module defined as one unit module of the multimodule unit to which a substrate is taken out in time nearest to time when a substrate is taken out from the module preceding the multimodule unit.

12. The substrate processing method according to claim 11 further comprising the step of taking out a substrate held in the unusable module by a second carrying means for carrying a substrate to a module at a downstream end among the modules when a substrate taken out from the module preceding the multimodule unit is to be carried to the unusable module and carrying the same substrate to a module ready to receive a substrate.

13. The substrate processing method according to claim 12, wherein a destination of the substrate held in the unusable module is the module at the downstream end.

14. The substrate processing method according to claim 12, wherein the modules capable of holding a substrate and identified by the module numbers are those included in a coating and developing system for coating a substrate with a resist and developing a latent image formed on a substrate by an exposure process and for forming a film on a substrate before a substrate is subjected to the exposure process.

15. The substrate processing method according to claim 12, wherein the modules capable of holding a substrate and identified by the module numbers are included in a coating and developing system for coating a substrate with a resist and developing a latent image formed on a substrate by an exposure process, and for processing a substrate by processes, including a developing process, to be executed after the exposure process.

16. The substrate processing method according to claim 11, wherein the modules capable of holding a substrate and identified by the module numbers are those included in a coating and developing system for coating a substrate with a resist and developing a latent image formed on a substrate by an exposure process and for forming a film on a substrate before a substrate is subjected to the exposure process.

17. The substrate processing method according to claim 11, wherein the modules capable of holding a substrate and identified by the module numbers are included in a coating and developing system for coating a substrate with a resist and developing a latent image formed on a substrate by an exposure process, and for processing a substrate by processes, including a developing process, to be executed after the exposure process.

18. A non-transitory storage medium storing a computer program, to be executed by a substrate processing system provided with modules capable of holding a substrate and identified by module numbers and capable of carrying a substrate to the modules in numerical carrying order indicated by the module numbers to process the substrate by predetermined processes, wherein the computer program is a set of instructions to be executed in the steps of the substrate processing method set according to claim 11.

19. A non-transitory storage medium storing a computer program, to be executed by a substrate processing system provided with modules capable of holding a substrate and identified by module numbers and capable of carrying a substrate to the modules in numerical carrying order indicated by the module numbers to process the substrate by predetermined processes, wherein the computer program is a set of instructions to be executed in the steps of the substrate processing method set according to claim 12.

\* \* \* \* \*